US010500823B2

(12) United States Patent
Piotrowski et al.

(10) Patent No.: US 10,500,823 B2
(45) Date of Patent: Dec. 10, 2019

(54) ACTIVE ESTER CURING AGENT COMPOUND FOR THERMOSETTING RESINS, FLAME RETARDANT COMPOSITION COMPRISING SAME, AND ARTICLES MADE THEREFROM

(71) Applicant: ICL-IP America Inc., Tarrytown, NY (US)

(72) Inventors: Andrew Piotrowski, Yorktown Heights, NY (US); Joseph Zilberman, Haifa (IL); Sergei V. Levchik, Croton on Hudson, NY (US); Meng Zhang, White Plains, NY (US); Eran Gluz, Hod Hasharon (IL); Kali Ananth Suryadevara, Saginaw Township, MI (US)

(73) Assignee: ICL-IP America Inc., Tarrytown, NY (US)

( * ) Notice: Subject to any disclaimer, the term of this patent is extended or adjusted under 35 U.S.C. 154(b) by 0 days.

(21) Appl. No.: 15/772,848

(22) PCT Filed: Nov. 1, 2016

(86) PCT No.: PCT/US2016/059878
§ 371 (c)(1),
(2) Date: May 2, 2018

(87) PCT Pub. No.: WO2017/083136
PCT Pub. Date: May 18, 2017

(65) Prior Publication Data
US 2018/0326708 A1 Nov. 15, 2018

Related U.S. Application Data

(60) Provisional application No. 62/254,847, filed on Nov. 13, 2015.

(51) Int. Cl.
*B32B 27/26* (2006.01)
*B32B 27/38* (2006.01)
(Continued)

(52) U.S. Cl.
CPC ............. *B32B 27/26* (2013.01); *B32B 15/08* (2013.01); *B32B 15/20* (2013.01); *B32B 27/08* (2013.01);
(Continued)

(58) Field of Classification Search
CPC .. B32B 27/26; C08G 59/4071; C08G 59/4276
See application file for complete search history.

(56) References Cited

U.S. PATENT DOCUMENTS 8,101,678 B2 * 1/2012 Roth ...................... C09K 21/12
524/117
2012/0095170 A1 4/2012 Kong et al.
(Continued)

FOREIGN PATENT DOCUMENTS

DE 102011118490 A1 * 5/2013 ........... C08K 5/5313
EP 2090618 A2 8/2009
(Continued)

OTHER PUBLICATIONS

Tachita Vlad-Bubulac, Corneliu Hamciuc & Oana Petreus, "Synthesis and Properties of Some Phosphorus-Containing Polyesters," 18 High Performance Polymers 255 (2006).*
(Continued)

*Primary Examiner* — Nicholas E Hill
(74) *Attorney, Agent, or Firm* — Dilworth & Barrese, LLP

(57) ABSTRACT

There is provided herein a flame retardant and curing agent compound for curing thermosetting resins, e.g., epoxy resins, a composition comprising a thermosetting resin, e.g., an epoxy resin and the curing agent, an article comprising the curing agent, and a method of making the curing agent.

24 Claims, 4 Drawing Sheets

(51) Int. Cl.

| | |
|---|---|
| *C08J 5/24* | (2006.01) |
| *C08G 59/42* | (2006.01) |
| *C08G 63/692* | (2006.01) |
| *H05K 1/03* | (2006.01) |
| *C08G 59/40* | (2006.01) |
| *C08L 63/00* | (2006.01) |
| *B32B 15/08* | (2006.01) |
| *B32B 15/20* | (2006.01) |
| *B32B 27/08* | (2006.01) |

(52) U.S. Cl.
CPC .......... *B32B 27/38* (2013.01); *C08G 59/4071* (2013.01); *C08G 59/4276* (2013.01); *C08G 63/6926* (2013.01); *C08J 5/24* (2013.01); *C08L 63/00* (2013.01); *H05K 1/0326* (2013.01); *H05K 1/0373* (2013.01); *B32B 2260/021* (2013.01); *B32B 2260/046* (2013.01); *B32B 2262/101* (2013.01); *B32B 2307/3065* (2013.01); *B32B 2457/08* (2013.01); *C08J 2363/00* (2013.01); *H05K 2201/012* (2013.01)

(56) References Cited

U.S. PATENT DOCUMENTS

2013/0146344 A1* 6/2013 Lee .................. C08L 67/00
174/258
2015/0189745 A1 7/2015 Zeng et al.

FOREIGN PATENT DOCUMENTS

| EP | 2896653 A1 | 7/2015 | | |
|---|---|---|---|---|
| JP | S6155115 A | * | 3/1986 | |
| JP | S61136519 A | * | 6/1986 | |
| JP | S62133114 A | * | 6/1987 | |
| JP | H09235480 A | * | 9/1997 | |
| JP | 2003128784 A | * | 5/2003 | |
| JP | 2004161805 A | * | 6/2004 | |
| JP | 2009161630 A | * | 7/2009 | |
| JP | 2009242589 A | * | 10/2009 | |
| WO | WO-2010051182 A1 | * | 5/2010 | ............... B32B 5/26 |
| WO | 2010114279 A2 | | 10/2010 | |
| WO | WO-2014040262 A1 | * | 3/2014 | ............... C08K 5/49 |

OTHER PUBLICATIONS

Corneliu Hamciuc, et al., "Kinetics of Thermal Degradation in Non-Isothermal Conditions of Some Phosphorus-Containing Polyesters and Polyesterimides," 43 European Polymer Journal 980 (2007).*
Machine translation for JPS6155115, performed on Espacenet on May 26, 2019.*
Machine translation for JPS61136519, performed on Espacenet on May 26, 2019.*
Machine translation for JPS62133114, performed on Espacenet on May 26, 2019.*
Machine translation for JPH09235480, performed on Espacenet on May 26, 2019.*
Machine translation for JP2003128784, performed on Espacenet on May 26, 2019.*
Machine translation for JP2004161805, performed on Espacenet on May 26, 2019.*
Machine translation for J P2009161630, performed on Espacenet on May 26, 2019.*
Machine translation for JP2009242589, performed on Espacenet on May 26, 2019.*
Machine translation for DE102011118490, performed on Espacenet on May 26, 2019.*
International Search Report and Written Opinion from PCT/US2016/059878 dated Jan. 17, 2017.

* cited by examiner

Complex Viscosity Profile - Composition A

Overlays of storage modulus (G' – open circles), loss modulus (G" – filled circles) and complex viscosity (|η| – open squares) of the B-staged resin system in rheometer.

DMA measurement of Tg for the laminate (3°C/min)
Bell shaped line is Tan Delta and the other Storage Modulus

ACTIVE ESTER CURING AGENT COMPOUND FOR THERMOSETTING RESINS, FLAME RETARDANT COMPOSITION COMPRISING SAME, AND ARTICLES MADE THEREFROM

This application claims priority to International Application No. PCT/US2016/059878 filed Nov. 1, 2016; which claims priority to provisional U.S. Patent Application No. 62/254,847 filed on Nov. 13, 2015.

FIELD OF THE INVENTION

The present invention relates to the field of flame retardants, specifically phosphorus-containing flame retardants for electronic applications such as printed circuit boards.

BACKGROUND OF THE INVENTION

Thermosetting resins are widely used in both industrial and consumer electronics because of, among other things, their chemical resistance, mechanical strength and electrical properties. For example, thermosetting resins can be used in electronics as protective films, adhesive materials and/or insulating materials, such as interlayer insulating films. To be useful for these applications, the thermosetting resins must provide ease of handling and possess certain physical, thermal, electrical insulation and moisture resistant properties. For example, thermosetting resins having a low dielectric loss tangent, while maintaining a sufficiently low dielectric constant, can possess a desirable combination of properties for electronic applications, especially in situations requiring increased signal speed and frequency.

Thermosetting resins, however, can be flammable. As such, different approaches have been made to impart the desired level of flame resistance to thermosetting resins, such as epoxy resins, such approaches entailing the employment of either halogen-free flame retardant compounds or halogen-containing flame retardant compounds. Halogenated compounds, however, are now undergoing additional scrutiny, and the various non-halogenated compounds available are difficult to formulate to provide acceptable properties. It would be desirable to provide the desired level of flame retardancy and acceptable properties such as high glass transition temperature (Tg) and high thermal stability to a thermosetting resin, such as an epoxy resin, while still maintaining a suitable combination of properties for electronic applications.

SUMMARY OF THE INVENTION

It is therefore a feature of the present invention to provide a compound(s), which can concurrently function as a flame retardant and an active ester curing agent for thermosetting resins, such as epoxy resins, which cured epoxy resins can be employed in electronic applications while imparting high thermal resistance and thermal stability, high adhesive force, low water absorbance, low dielectric loss tangent, and simultaneously, a sufficiently low dielectric constant. It is known that many phosphorus-containing flame retardants react with epoxy resins with the formation of highly polar hydroxyl groups. For this reason, it is difficult to achieve good electrical properties in the cured products. In addition, most of the known flame retardants for epoxy resins are monofunctional or bifunctional, thus impairing the cross-linking density of the cured resin, which is finally reflected in a reduced glass-transition temperature.

The present invention provides phosphorus-containing flame retardants which are used as polyfunctional curing agents, resulting in a combination of highly satisfactory flame-retarding, mechanical and electrical characteristics in the cured products. These compounds are phosphorus-containing aromatic polyesters. When they are used as curing agents, it is possible to reduce the formation of undesirable hydroxyl groups during the curing reaction. In addition, the use of the curing agents of the invention enables an increase in the crosslinking density of the epoxy resin cured articles since these curing agents act as polyfunctional curing agents which have many reactive ester groups per molecule. As a result of their use, the glass transition temperature is high and the material is useful as an electrical insulating material.

The invention further provides epoxy resin compositions containing the said phosphorus-containing flame-retardant polyfunctional curing agent compounds that exhibit excellent fire retardant, mechanical and electrical properties.

It will be understood herein that in one non-limiting embodiment the expression "active ester curing agent compound" can be used interchangeably with "curing agent for epoxy resins", "epoxy curing agent", "curing agent for epoxy", "epoxy resin curing agent" and "curing agent", and the like.

There is provided in one embodiment herein a compound having the general formula (I):

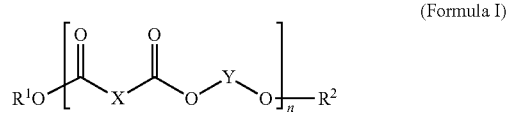

(Formula I)

where X is a bivalent aromatic hydrocarbon group containing from 6 to about 12 carbon atoms, and which includes the non-limiting examples of phenylene groups, naphthalene groups, biphenylene groups, etc., which groups may optionally include a substituent bonded to the aromatic ring, such as an alkyl group or alkoxyl group containing up to 6 carbon atoms, or X is a bivalent linear or branched alkylene group of from 1 to 8 carbon atoms, or a bivalent linear or branched alkenylene group of from 2 to about 8 carbon atoms, Y is

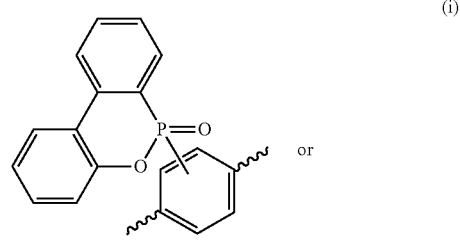

(i)

or

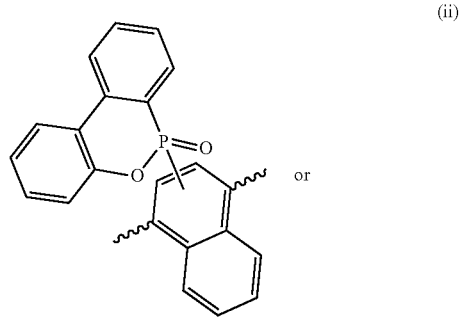

(ii)

or

-continued

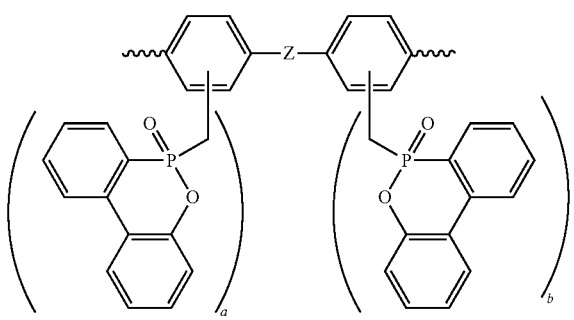
(iii)

where Z is selected from the group consisting of a covalent bond, —SO$_2$—, —C(CH$_3$)$_2$—, —CH(CH$_3$)—, and —CH$_2$—; a=0-2; b=0-2 wherein the wavy lines of each structure of Y indicate the bonds to the O atoms which Y bridges in the general formula (I);

R$^1$ is H, an alkyl group of from 1 to about 4 carbon atoms, phenyl, naphthyl,

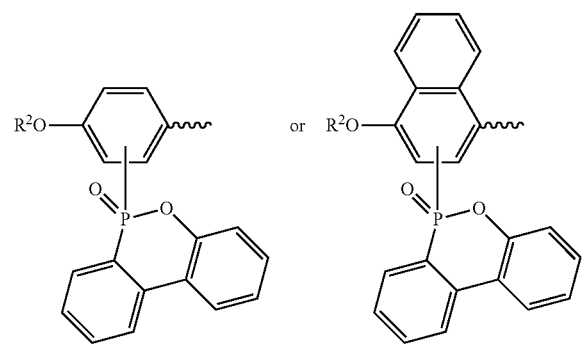

where R$^2$ is H or —C(=O)R$^3$ and where R$^3$ is selected from an alkyl group of from 1 to 4 carbon atoms, a phenyl group, a napthyl group and an aromatic phenol group which is selected from one of a phenol group, o-cresol group, m-cresol group, p-cresol group, a-naphthol group, and a β-naphthol group, and when R$^2$ is H, R$^1$ cannot be phenyl or naphtyl, and n is ≥1.

In one non-limiting embodiment herein, the phosphorus-containing flame-retardant polyfunctional curing agent can comprise a mixture of different structures of the general formula (I), e.g., the mixture can comprise wherein at least 50 wt % of the general formula (I) structures, and preferably more than 70 wt % of the general formula (I) structures are such that Y is chosen from moieties (i) and (ii) as noted above, with the remaining different structures of the general formula (I) being such that Y is chosen from the (iii) moiety noted above.

It will be understood that the compound of the formula (I), as described herein, can function both as a flame retardant and as a curing agent for curing thermosetting resins, such as epoxy resins, as described herein.

DETAILED DESCRIPTION OF THE INVENTION

Figure 1:
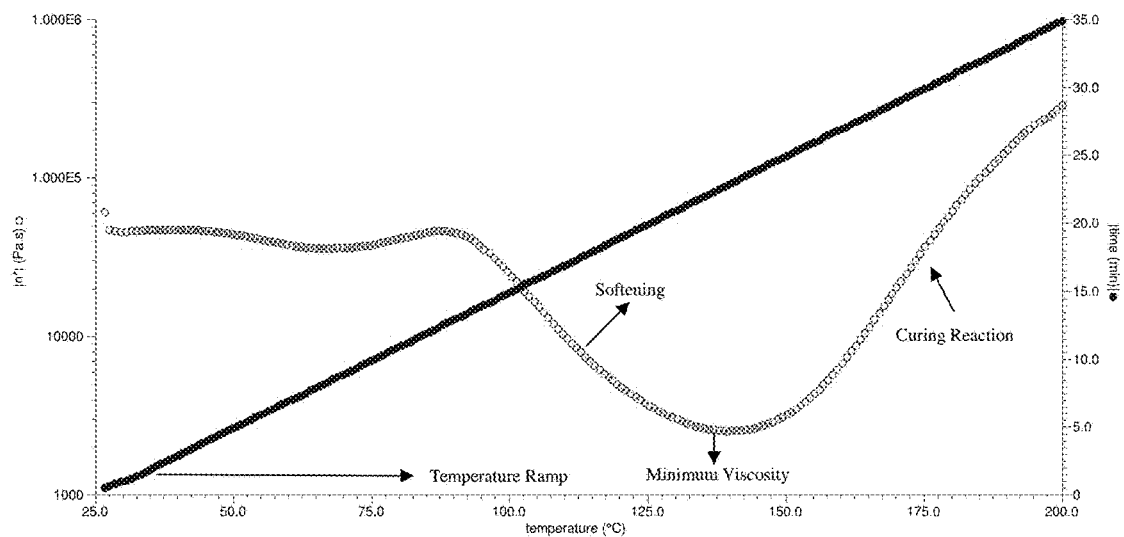
FIG. 1 is a graph of the dynamic viscosity (open circles) profile of B-stage prepreg containing Composition A of Example 11, at a ramp rate (filled circles) of 5° C./min in a rheometer under continuous controlled strain and normal force conditions.

The present invention is directed to compound(s), which can concurrently function as a flame retardant and an active ester curing agent(s) compound for thermosetting resins, such as epoxy resins, which cured epoxy resins can be employed in electronic applications while maintaining high thermal resistance and thermal stability, high adhesive force, low water absorbance, low dielectric loss tangent, and simultaneously, a sufficiently low dielectric constant.

Advantageously, the compound(s) which function as the active ester curing agent compound(s) for thermosetting resins, such as epoxy resins, when reacted with epoxy resins, produce products which do not have or almost do not have hydroxyl groups such as secondary hydroxyl groups, thus preventing the high water absorption and higher dielectric constant of conventional curing systems, which when reacted with epoxy produce products which contain such secondary hydroxyl groups.

In addition, they are polyfunctional curing agents providing a high degree of crosslinking density that results in an exceptionally high Tg and excellent thermal stability.

Some more specific embodiments of the compound(s) which can be used as the curing agent compound for curing thermosetting resins, such as epoxy resins, is a compound of the general formula (I) as described above.

In one embodiment of general formula (I), R$^1$ can be of the general formula:

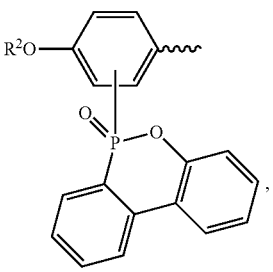

wherein R$^2$ is as defined above.

In another embodiment herein of general formula (I), R$^1$ can be an alkyl of from 1 to about 4 carbon atoms, more specifically selected from methyl or ethyl.

In a more specific embodiment of general formula (I), X can be of the general formula:

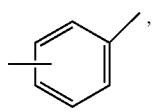

more specifically,

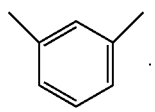

In another more specific embodiment of general formula (I), X can be a divalent linear or branched alkylene group of from 1 to 8 carbon atoms, more specifically from 1 to about 4 carbon atoms, most specifically selected from the group consisting of methylene, ethylene, isopropylene and butylene.

In another specific embodiment of general formula (I) described above, X can be a divalent linear or branched alkenylene group of from 2 to 8 carbon atoms, more specifically from 2 to about 4 carbon atoms, most specifically selected from the group consisting of ethenylene, propenylene and isopropenylene.

In yet another embodiment of general formula (I), Y can be of the general formula:

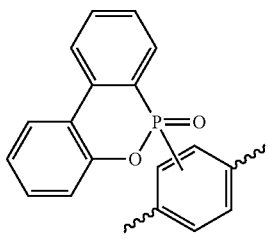

as described above.

In one other embodiment of general formula (I), Y can be of the general formula:

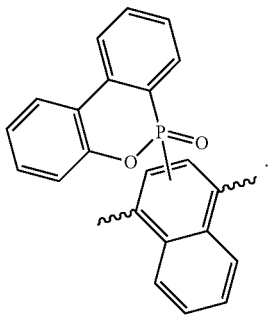

In one embodiment herein of general formula (I), the value of the subscript n can be of from 1 to about 100, more specifically from 1 to about 15, and most specifically from 1 to about 7. In one non-limiting embodiment, n can be 1, provided that $R^1$ is of the general formula:

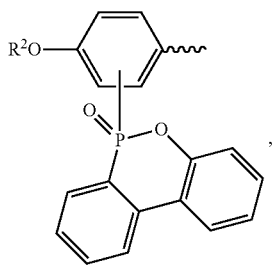

wherein $R^2$ is as defined above.

In another embodiment, the compound(s) which can be used as the curing agent compound for curing thermosetting resins, such as epoxy resins (e.g., the active ester curing agent for epoxy resins described herein) can be a phosphorus-containing compound of the general formula (I) such as those having at least three reactive groups per molecule, wherein at least two of the reactive groups are active ester groups. More preferably the phosphorus-containing compounds of the general formula (I) are those having at least four reactive groups per molecule, while the number of active ester groups is at least three.

Compounds of the general formula (I) as described herein may also be used as a non-reactive additive, such as when used with other thermosetting systems, e.g., other than epoxy. For example, compounds of the general formula (I) noted herein can be used as a charring agent to provide an insulating layer of char at elevated temperatures for thermosetting formulations.

The term active ester refers to an aromatic ester that can react with an epoxy group according to the following scheme:

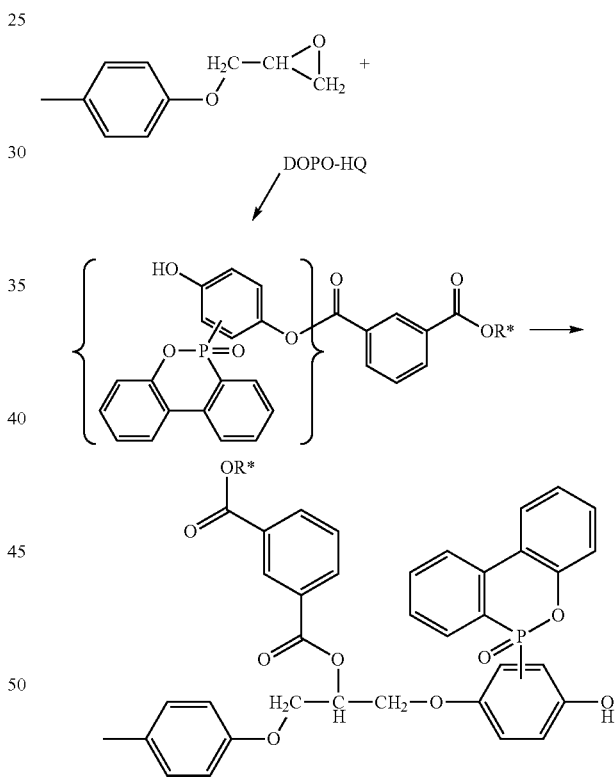

Specific Curing mechanism with DOPO-HQ (10-(2',5'-dihydroxyphenyl)-9,10-dihydro-9-oxa-10-phosphaphenanthrene-10-oxide) where R* is an alkyl or aryl group containing up to 12 carbon atoms;

in contrast to a conventional epoxy curing scheme:

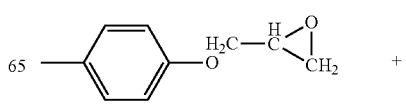

-continued

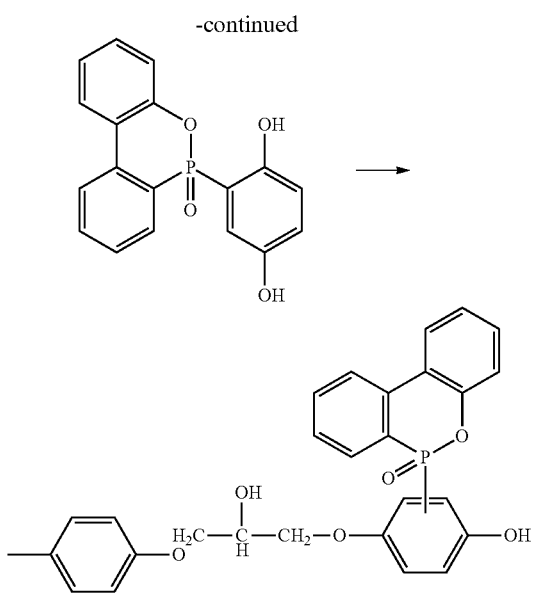

Since the curing agent acts as a polyfunctional curing agent, a cured article therefrom has a high crosslink density which is reflected in an exceptionally high Tg. Since the formation of highly polar and thermally liable hydroxyl groups is minimized during the curing, a cured article has a high thermal stability and low dissipation factor. Since the curing agent has a bulky structure, crystallization of the molecule chain is prevented and the solubility of the polyester curing agent in an epoxy resin composition is very good. In contrast to the compounds of EP 1 416 007 A1, the compounds of the present invention also provide excellent flame retardancy.

In one embodiment herein there are provided compounds, compositions and/or formulations obtainable by reacting, blending or mixing compound(s) of the general formula (I), with other components such as a thermosetting resin to form various ignition resistant compounds, compositions or formulations useful in various applications such as prepregs, laminates, coatings, molding articles and composite products.

Another embodiment herein is directed to phosphorus-containing epoxy resin curable formulations comprising (i) compound(s) of the general formula (I), (ii) an epoxy resin or a mixture of epoxy resins, (iii) optionally, a co-crosslinker, (iv), optionally, a curing catalyst, and (v) optionally, a Lewis acid.

In yet another embodiment herein there is provided a curable flame-resistant epoxy resin composition comprising (i) the compound of the general formula (I), (ii) optionally, a benzoxazine-containing compound, (iii) a crosslinkable epoxy resin or a blend of two or more epoxy resins having more than one epoxy group per molecule, (iv) optionally a co-crosslinker and, (v) optionally, a curing catalyst, to obtain a curable flame-resistant epoxy resin composition. Such curable flame-resistant epoxy resin compositions may be used to make prepregs, which prepregs may be used to make laminates and circuit boards useful in the electronics industry. The epoxy resin composition may also be used to coat metallic foils, such as copper foils, to make resin-coated copper foils for so called build-up technology.

The compound(s) of the general formula (I) described herein and derivatives thereof, may also be combined with at least one thermosetting system (epoxy and curing agents) to make a hybrid ignition-resistant thermosetting composition.

Ignition-Resistant Epoxy Resin Composition (Epoxy Resin Composition)

In one embodiment of the present invention, the compound(s) of the general formula (I) described herein, as well as in one embodiment and combinations thereof, may be used as one component of a curable (crosslinkable) phosphorus-containing flame-resistant epoxy resin composition. In this embodiment, the curable phosphorus-containing flame-resistant epoxy resin composition comprises (i) the compound(s) of the general formula (I) described herein, (ii) at least one epoxy resin such as those selected from halogen-free epoxies, phosphorus-free epoxies, and phosphorus-containing epoxies, and mixtures thereof, including, but not limited to, DEN 438, DER 330 Epon 164 (DEN and DER are trademarks of The Dow Chemical Company), epoxy functional polyoxazolidone-containing compounds, cycloaliphatic epoxies, GMA/styrene copolymers, and the reaction product of DEN 438 and DOPO resins; and optionally (iii) at least one co-crosslinker, and optionally one or more of a curing catalyst, a Lewis acid, an inhibitor, and a benzoxazine-containing compound. The curable phosphorus-containing flame-resistant epoxy resin composition optionally may contain at least one additional crosslinkable epoxy resin or a blend of two or more epoxy resins other than and different from component (ii) above. The curable phosphorus-containing flame-resistant epoxy resin composition may also optionally contain at least one curing catalyst and at least one inhibitor. All of the above components may be blended or mixed together in any order to form the curable phosphorus-containing flame-resistant epoxy resin composition.

The curable phosphorus-containing flame-resistant epoxy resin compositions prepared according to the present invention, made by reacting a mixture of compound(s) of the general formula (I) described herein, an epoxy resin, and optionally another co-crosslinker (i.e. another curing agent); may be used to make prepregs, laminates and circuit boards useful in the electronics industry and as a phosphorus-containing flame-resistant epoxy resin composition to coat metallic foils for so called build-up technology as described above.

The epoxy resins which can be used in the herein described invention include, in one embodiment, polyepoxides having the following general Formula (II):

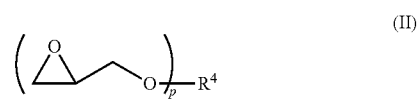

wherein "$R^4$" is a substituted or unsubstituted aromatic, aliphatic, cycloaliphatic or heterocyclic group having a valence of "p", where "p" preferably has an average value of from 1 to less than about 8. Examples of the polyepoxide compounds useful in the present invention include the diglycidyl ethers of the following compounds: resorcinol, catechol, hydroquinone, 4,4'-biphenol, bisphenol A, bisphenol AP (1,1-bis(4-hydroxylphenyl)-1-phenyl ethane), bisphenol F, bisphenol K, phenol-formaldehyde novolac resins, alkyl-substituted phenol-formaldehyde resins, phenol-hydroxybenzaldehyde resins, cresol-hydroxybenzaldehyde resins, dicyclopentadiene-phenol resins, dicyclopentadiene-substituted phenol resins, tetramethylbiphenol, and any combinations thereof.

Examples of particular polyepoxide compounds useful in the present invention include a diglycidyl ether of bisphenol A having an epoxy equivalent weight (EEW) between 177 and 189 sold by The Dow Chemical Company under the trademark D.E.R. 330; and halogen-free epoxy-terminated polyoxazolidone resins, phosphorus-containing epoxy compounds; cycloaliphatic epoxies; and copolymers of glycidyl methacrylate ethers and styrene.

Preferred polyepoxide compounds include epoxy novolacs, such as D.E.N. 438 or D.E.N. 439 (trademarks of The Dow Chemical Company); cresole epoxy novolacs such as QUATREX 3310, 3410 and 3710 available from Ciba Geigy; Epon 164 from Momentive, trisepoxy compounds, such as TACTIX 742 from Ciba Geigy; epoxidized bisphenol A novolacs, dicyclopentadiene phenol epoxy novolacs; glycidyl ethers of tetraphenolethane; diglycidyl ethers of bisphenol-A; diglycidyl ethers of bisphenol-F; and diglycidyl ethers of hydroquinone.

In one embodiment, the most preferred epoxy compounds are epoxy novolac resins (sometimes referred to as epoxidized novolac resins, a term which is intended to embrace both epoxy phenol novolac resins and epoxy cresol novolac resins). Epoxy novolac resins (including epoxy cresol novolac resins) are readily commercially available, for example under the trade names D.E.N. (trademark of The Dow Chemical Company), and QUATREX and TACTIX 742 (trademarks of Ciba Geigy).

Preferred compounds of the type mentioned above have an epoxy equivalent between 150-400 and most preferably from 160-300 and a molecular weight above 500 and most preferable between 700-2500.

The polyepoxide useful in the present invention is preferably substantially free (or completely free) of bromine atoms, and more preferably substantially free (or completely free) of halogen atoms.

One non-limiting example of polyepoxides that are useful in the present invention and that are substantially free of halogen atoms are the phosphorus-containing epoxy resins such as those which are the reaction products of an epoxy compound containing at least two epoxy groups and a reactive phosphorus-containing compound such as 3,4,5,6-dibenzo-1,2-oxaphosphane-2-oxide (DOPO), or 10-(2',5'-dihydroxyphenyl)-9,10-dihydro-9-oxa-10-phosphaphenanthrene-10-oxide (DOPO-HQ).

The amount of epoxy in the compositions described herein, i.e., the curable phosphorus-containing flame-resistant epoxy resin compositions, the thermoset composition and the hybrid composition, are such that in the final formulation of the epoxy, any optional phosphorus-containing epoxy based on compound(s) of the general formula (I) described herein in the amounts described herein, and any other components in the amounts described herein or known to those skilled in the art, is such that the total phosphorus content of the composition is from 1 weight percent to about 5 weight percent, more specifically from about 2 to about 3.5 weight percent. Thus, one skilled in the art will formulate the amount of epoxy to be commensurate with such other components, so as to have the final phosphorus content as described above.

The amount of such phosphorus-containing epoxy in the final composition can vary from 10-90 parts, preferably 20-80 parts and most preferably from 30-50 parts, based on 100 parts of epoxy resin.

The amounts of epoxy resin described herein can in one non-limiting embodiment be equal to the amounts of the thermoplastic resin in the thermoplastic composition described herein, the thermoset resin in the thermoset composition described herein and the combined amount of the resins in the hybrid composition described herein.

The effective flame-retardant amount of the compound(s) of the general formula (I) described herein which can be used as the compound for the curing epoxy resin herein, in the curable epoxy resin composition described herein, will vary, depending on the specific epoxy resin and the specific compound being employed, as well as the specific parameters of processing as are known by those skilled in the art. In one non-limiting embodiment, the effective flame-retardant amount of compound(s) of the general formula (I) described herein which can be used for curing the epoxy resin is from about 10 to about 150 parts by weight per 100 parts of the epoxy resin, more specifically from about 30 to about 100 parts by weight per 100 parts of the epoxy resin and most specifically from about 50 to about 70 parts by weight per 100 parts of the epoxy resin. To provide adequate flame retardancy, the compositions herein will contain from 1% to about 5% phosphorus in the final composition. In one embodiment, the above stated amounts of compound(s) of the general formula (I) described herein can be the amounts of compound(s) of the general formula (I) described herein used in any of the epoxy resin compositions, the thermoset composition, and the hybrid composition, described herein.

As described above, phosphorus-containing flame-resistant epoxy resin compositions may be formed by blending (i) compound(s) of the general formula (I) described herein, (ii) at least one crosslinkable epoxy compound, and optionally (iii) at least one co-crosslinker, as well as any of the other optional components described herein; or in another embodiment, the phosphorus-containing flame-resistant epoxy resin compositions may be formed by blending (i) an epoxidized compound(s) based on compounds of the general formula (I) described herein, at least one crosslinkable phosphorus-containing compound, and (iii) at least one co-crosslinker, as well as any of the other optional components described herein. The phosphorus-containing flame-resistant epoxy resin compositions may, optionally, contain at least one crosslinkable epoxy resin other than the crosslinkable phosphorus-containing compounds in (ii) above. In one embodiment herein it will be understood that the term "crosslinkable" in crosslinkable phosphorus-containing compound, is understood to be a phosphorus-containing epoxy compound which has more than 2 epoxy functionalities, as would be understood by those skilled in the art.

With any of the compositions above where an epoxy resin is present, any number of co-crosslinking agents (i.e., in addition to the phosphorus compound(s) of the general formula (I) described herein) may optionally also be used. Suitable co-crosslinkers that may optionally be present in combination with the phosphorus-containing epoxy compounds according to the present invention include, for example, multifunctional co-crosslinkers as are known to those skilled in the art.

The co-crosslinkers include, for example, copolymers of styrene and maleic anhydride having a molecular weight ($M_w$) in the range of from 1,500 to 50,000 and an anhydride content of more than 15 percent. Commercial examples of these materials include SMA 1000, SMA 2000, and SMA 3000 and SMA 4000 having styrene-maleic anhydride ratios of 1:1, 2:1, 3:1 and 4:1, respectively, and having molecular weights ranging from 6,000 to 15,000, which are available from Elf Atochem S.A.

Other preferred co-crosslinkers useful in the present invention include hydroxyl-containing compounds such as those represented by the following Formula (III):

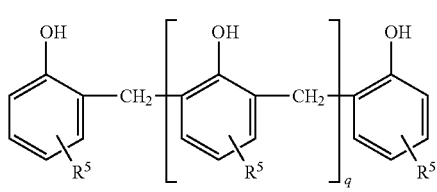

(III)

wherein "$R^5$" is a hydrogen or an alkyl group having from 1 to 20, preferably from 1 to 10, and more preferably 1 to 5 carbon atoms and "q" is an integer of from 0 to 20, preferably from 1 to 10, and more preferably from 2 to 5.

Commercially available products having the above Formula (III) include, for example, PERSTORP 85.36.28, which is a phenolic resin obtained from phenol and formaldehyde, having an average Mettler softening point of 103° C., a melt viscosity at 150° C.=1.2 Pas and a functionality of 6 to 7. Another example includes SD1708 (from Momentive): Viscosity at 150° C., 2200-3800 cps, Softening Pt: 110° C.; HRJ13399 (from SI Group): Specific Gravity 1.20, Softening Pt: 90-105° C.; HRJ12952 (from SI Group): Specific Gravity 1.25, Softening Pt: 97-107° C.; FRJ425 (from SI Group): Specific Gravity 1.24, Softening Pt: 112-118° C.; BRJ 473 liquid (from SI Group): Specific Gravity 1.10, Brookfield viscosity: 1000-4500 cps.

One example of a co-crosslinker that is suitable in the compositions described herein is an active ester phenolic resin with the general formula (IV):

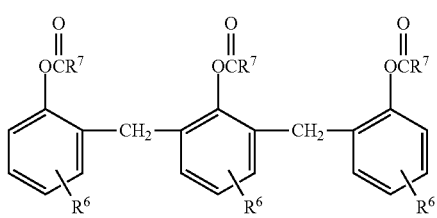

(IV)

where $R^6$ is hydrogen, an aliphatic moiety of from 1 to 10 carbon atoms, or a phenyl or a substituted phenyl; $R^7$ is an aliphatic moiety of from 1 to 4 carbon atoms, or a phenyl or a substituted phenyl group. One example of a commercial curing system of this type is EPICLON HPC-8000-65T, available from DIC corporation, Japan.

Other phenolic functional materials which are suitable as co-crosslinkers include compounds which upon heating form a phenolic crosslinking agent having a functionality of at least 2. Some examples of these compounds are benzoxazine group-containing compounds. Examples of compounds which form a phenolic crosslinking agent upon heating include phenolic species obtained from heating benzoxazine, for example as illustrated in the following chemical equation:

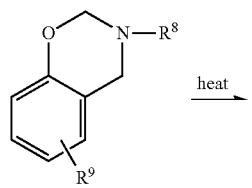

heat →

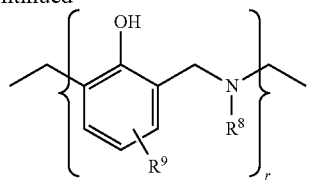

wherein "r is greater than 1 and is preferably up to about 100,000; and wherein "$R^8$" and "$R^9$" may be, independently and separately, the same or different hydrogen, an allyl group from 1 to about 10 carbon atoms such as methyl, a 6 to 20 carbon atom aromatic group such as phenyl, or a 4 to 20 carbon atom cycloaliphatic group such as cyclohexane.

Examples of the above compounds also include benzoxazine of phenolphthalein, benzoxazine of bisphenol-A, benzoxazine of bisphenol-F, benzoxazine of phenol novolac, and mixtures thereof. A mixture of these compounds and Formula (III) and/or (IV) may also be used in the present invention. Non-limiting examples of commercial benzoxazines from Huntsman include examples such as Bisphenol A benzoxazine (MT35600); Bisphenol F benzoxazine (MT35700); Phenolphthalein benzoxazine (MT35800); Thiodiphenol benzoxazine (MT35900), and Dicyclopentadiene benzoxazine (MT36000).

When a co-crosslinker is used in the present invention, the co-crosslinker is present in an amount to crosslink of less than 50 percent of the stoichiometric amount needed to cure the thermosetting resin, such as the epoxy resin, and is more preferably less than about 40% of the amount needed to cure the thermosetting resin, such as the epoxy resin, and is most preferably less than about 35% of the amount needed to cure the thermosetting resin, such as the epoxy resin.

Any of the curable compositions of the present invention described herein may comprise a curing catalyst. Examples of suitable curing catalyst materials (catalyst) useful in the present invention include compounds containing amine, phosphine, ammonium, phosphonium, arsonium or sulfonium moieties or mixtures thereof. Particularly preferred catalysts are heterocyclic nitrogen-containing compounds.

The catalysts (as distinguished from the co-crosslinkers) preferably contain on average no more than about 1 active hydrogen moiety per molecule. Active hydrogen moieties include hydrogen atoms bonded to an amine group, a phenolic hydroxyl group, or a carboxylic acid group. For instance, the amine and phosphine moieties in catalysts are preferably tertiary amine or phosphine moieties; and the ammonium and phosphonium moieties are preferably quaternary ammonium and phosphonium moieties.

Among preferred tertiary amines that may be used as catalysts are those mono- or polyamines having an open-chain or cyclic structure, which have all of the amine hydrogen replaced by suitable substituents such as hydrocarbyl radicals, and preferably aliphatic, cycloaliphatic or aromatic radicals.

Examples of these amines include, among others, 1,8-diazabicyclo(5.4.0)undec-7-en (DBU), methyl diethanolamine, triethylamine, tributylamine, dimethyl benzylamine, triphenylamine, tricyclohexyl amine, pyridine and quinoline. Preferred amines are trialkyl, tricycloalkyl and triaryl amines, such as triethylamine, triphenylamine, tri-(2,3-dimethyl cyclohexyl)amine, and alkyl dialkanol amines, such as methyl diethanol amines and trialkanolamines such as triethanolamine. Weak tertiary amines, for example amines that in aqueous solutions give a pH less than 10 in aqueous solutions of 1 M concentration, are particularly preferred. Especially preferred tertiary amine catalysts are benzyldimethylamine and tris-(dimethylaminomethyl)phenol.

Examples of suitable heterocyclic nitrogen-containing catalysts which can be employed herein include heterocyclic secondary and tertiary amines or nitrogen-containing catalysts which include, for example, imidazoles, benzimidazoles, imidazolidines, imidazolines, oxazoles, pyrroles, thiazoles, pyridines, pyrazines, morpholines, pyridazines, pyrimidines, pyrrolidines, pyrazoles, quinoxalines, quinazolines, phthalozines, quinolines, purines, indazoles, indoles, indolazines, phenazines, phenarsazines, phenothiazines, pyrrolines, indolines, piperidines, piperazines and combinations thereof. Especially preferred are alkyl-substituted imidazoles; 2,5-chloro-4-ethyl imidazole; and phenyl-substituted imidazoles, and mixtures thereof. Even more preferred are N-methylimidazole; 2-methylimidazole; 2-ethyl-4-methylimidazole; 1,2-dimethylimidazole; 2-methylimidazole and mixtures thereof. Especially preferred is 2-phenylimidazole.

The amount of curing catalyst used depends on the molecular weight of the catalyst, the activity of the catalyst and the speed at which the polymerization is intended to proceed. In general, the curing catalyst is used in an amount of from 0.01 parts per 100 parts of resin (p.h.r.) to about 1.0 p.h.r., more specifically, from about 0.01 p.h.r. to about 0.5 p.h.r. and, most specifically, from about 0.1 p.h.r. to about 0.5 p.h.r. In one embodiment herein it will be understood that the parts of resin relate to the parts of curable epoxy resin described herein, i.e., the total amount of the curable composition excluding catalyst (total grams of epoxy+compound(s) of the general formula (I) described herein and any other components present other than the curing catalyst=100% and then taking 100 grams of this is equal to 100 parts of resin); catalyst is added in the above ranges to 100 parts of this total weight amount.

Preferably, a Lewis acid is also employed in any of the curable epoxy resin compositions of the present invention described herein, especially when the catalyst is particularly a heterocyclic nitrogen-containing compound.

The Lewis acids useful in the present invention include for example one or a mixture of two or more halides, oxides, hydroxides and alkoxides of zinc, tin, titanium, cobalt, manganese, iron, silicon, aluminum, and boron, for example Lewis acids of boron, and anhydrides of Lewis acids of boron, such as boric acid, metaboric acid, optionally substituted boroxines (such as trimethoxyboroxine), optionally substituted oxides of boron, alkyl borates, boron halides, zinc halides (such as zinc chloride) and other Lewis acids that tend to have a relatively weak conjugate base. Preferably, the Lewis acid is a Lewis acid of boron, or an anhydride of a Lewis acid of boron, for example boric acid, metaboric acid, an optionally substituted boroxine (such as trimethoxy boroxine, trimethyl boroxine or triethyl boroxine), an optionally substituted oxide of boron, or an alkyl borate. The most preferred Lewis acid is boric acid. These Lewis acids are very effective in curing epoxy resins when combined with the heterocyclic nitrogen-containing compounds referred to above.

The Lewis acids and amines can be combined before mixing into the formulation or by mixing with the catalyst in situ, to make a curing catalyst combination.

The amount of the Lewis acid employed is preferably at least 0.1 mole of Lewis acid per mole of heterocyclic nitrogen compound, more preferably at least 0.3 mole of Lewis acid per mole of heterocyclic nitrogen-containing compound.

The curable compositions of the present invention may optionally have boric acid and/or maleic acid present as a cure inhibitor. In that case, the curing agent is preferably a polyamine or polyamide. The amount of cure inhibitor will be known by those skilled in the art.

The curable compositions of the present invention may also optionally contain one or more additional flame retardant additives including, for example, red phosphorus, encapsulated red phosphorus or liquid or solid phosphorus-containing compounds, for example, "EXOLIT OP 930", EXOLIT OP 910 from Clariant GmbH and ammonium polyphosphate such as "EXOLIT 700" from Clariant GmbH, a phosphite, or phosphazenes; nitrogen-containing fire retardants and/or synergists, for example melamines, melem, cyanuric acid, isocyanuric acid and derivatives of those nitrogen-containing compounds; halogenated flame retardants and halogenated epoxy resins (especially brominated epoxy resins); synergistic phosphorus-halogen-containing chemicals or compounds containing salts of organic acids; inorganic metal hydrates such as $Sb_2O_3$, $Sb_3O_5$, aluminum trihydroxide and magnesium hydroxide, such as "ZEROGEN 30" from Martinswerke GmbH of Germany, and more preferably, an aluminum trihydroxide such as "MARTINAL TS-610" from Martinswerke GmbH of Germany; boron-containing compounds; antimony-containing compounds; silica and combinations thereof.

When additional flame retardants which contain phosphorus are present in the composition of the present invention, the phosphorus-containing flame retardants are preferably present in amounts such that the total phosphorus content of the epoxy resin composition is from 0.2 wt. percent to 5 wt. percent.

The curable compositions of the present invention may also optionally contain other additives of a generally conventional type including for example, stabilizers, other organic or inorganic additives, pigments, wetting agents, flow modifiers, UV light blockers, and fluorescent additives. These additives can be present in amounts of from 0 to 5 wt. percent and are preferably present in amounts of less than 3 wt. percent.

The flame-resistant epoxy resin is preferably free of bromine atoms, and more preferably free of halogen atoms.

The compositions described above are useful for making coating formulations, encapsulation, composites, and adhesives, molding, bonding sheets, and laminated plates. The compositions of the present invention can be used to make composite materials by techniques well-known in the industry, such as by pultrusion, molding, encapsulation, or coating. As an illustration, a coating formulation may comprise (i) compound(s) of the general formula (I) described herein (ii) a solid epoxy resin, and (iii) a hardener such as an amine or phenolic hardener. The amounts of hardener will be known by those skilled in the art.

The present invention is particularly useful for making B-staged prepregs, laminates, bonding sheets, and resin-coated copper foils by well known techniques in the industry.

Ignition-Resistant Thermosetting Composition (Thermosetting Composition)

In another embodiment of the present invention, the compound(s) of the general formula (I) described herein is used to make a phosphorus-containing ignition-resistant thermosetting composition, e.g., in one non-limiting embodiment wherein the thermoset polymer is in addition to, or other than, epoxy.

A halogen-free ignition-resistant thermosetting composition is obtainable by blending (i) compound(s) of the general formula (I) described herein with (ii) at least one thermosetting system. Examples of thermosetting systems are epoxy, polyurethane, polyisocyanates, benzoxazine ring-containing compounds, unsaturated resin systems containing double or triple bonds, polycyanate ester, bismaleimide, triazine, bismaleimide and mixtures thereof.

The thermoset resin compositions herein can contain any of the components and or ranges of amounts of such components described herein for the curable epoxy resin composition or the hybrid compositions, and vice-versa, and of the thermoset resin composition, i.e., any of the components and or amounts of the components of the thermoset composition described herein can be used in any of the epoxy compositions, or the hybrid compositions described herein.

In one embodiment herein there is provided an article that contains any of the composition(s) described herein. In one embodiment the article herein can be used in lead-free soldering applications and electronic devices, e.g., printed circuit board applications. Specifically, the article can be a prepreg and/or a laminate. In one specific embodiment there is provided a laminate and/or a prepreg that contains any one or more of the compositions described herein. In one other embodiment there is provided herein a printed circuit board, optionally a multilayer printed circuit board, comprising one or more prepreg(s) and/or a laminate (either uncured, partially cured or completely cured) wherein said prepreg(s) and/or laminate comprises any one or more of the compositions described herein. In one embodiment there is provided a printed circuit board comprising a prepreg and/or a laminate, wherein said prepreg and/or laminate comprises any one of the compositions described herein.

Partial curing as used herein can comprise any level of curing, short of complete cure, and will vary widely depending on the specific materials and conditions of manufacture as well as the desired end-use applications. In one specific embodiment, the article herein can further comprise a copper foil. In one embodiment the article can comprise a printed circuit board. In one embodiment there is provided an FR-4 laminate which comprises a prepreg and/or laminate of the invention. In a more specific embodiment there is provided a printed circuit board comprising an FR-4 laminate, wherein the FR-4 laminate comprises a prepreg or laminate of the invention.

In one embodiment herein there is provided a process for making a laminate that contains any of the compositions described herein, which process comprises impregnating the respective composition(s) into a filler material, e.g., a glass fiber mat to form a prepreg, followed by processing the prepreg at an elevated temperature and/or pressure to promote a partial cure to a B-stage and then laminating two or more of said prepregs to form said laminate. In one embodiment, said laminate and/or prepreg can be used in the applications described herein, e.g., printed circuit boards.

It is provided herein, that any of the compositions described herein are useful for making a prepreg and/or laminate with a good balance of laminate properties and thermal stability, such as one or more of high $T_g$ (i.e. above 130° C.), a $T_d$ of 330° C. and above, a $t_{288}$ of 5 minutes and above, a flame resistance rating of V-0, good toughness, and good adhesion to copper foil. In recent years the $T_d$ has become one of the most important parameters, because the industry is changing to lead-free solders which melt at a higher temperature than traditional tin-lead solders.

In one embodiment herein, the compositions described herein can be used in other applications, e.g., encapsulants for electronic elements, protective coatings, structural adhesives, structural and/or decorative composite materials, in amounts as deemed necessary depending on the particular application.

In yet a further embodiment herein there is provided a method for making an active ester curing agent for thermosetting resins, such as epoxy resins.

In one non-limiting embodiment herein, the method of making the active ester curing agent of the compound(s) of the general formula (I) described herein can comprise the following general reaction mechanism:

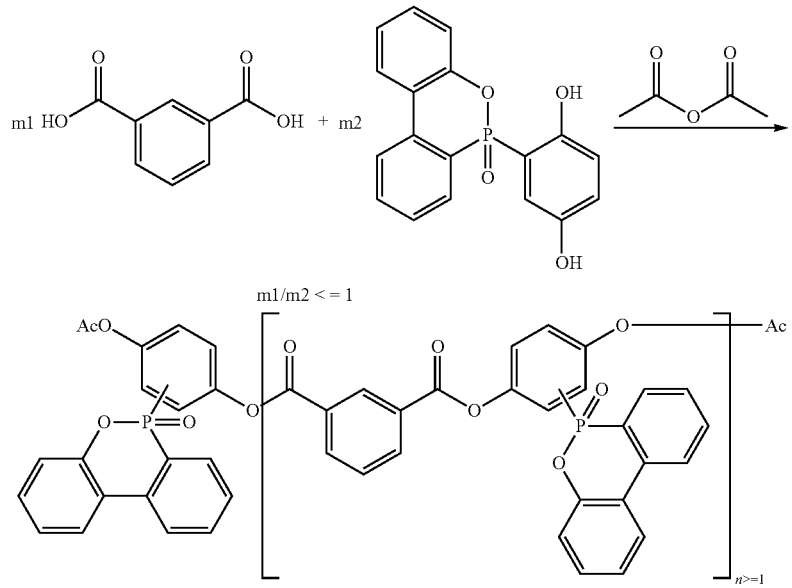

where Ac=acetyl moiety

This reaction does not require the use of any additional solvents. Acetic anhydride is both solvent and reagent. It is used between 1 to 10 molar excess and most preferably 2 to 5 molar excess with respect to DOPO-HQ. The reaction is carried out at 170° C.-260° C. and most preferably 190° C.-240° C. for a period of 1-16 hours and most preferably 5-8 hours.

Other non-limiting embodiments for making an active ester curing agent for thermosetting resin are described in the examples below.

While the invention has been described with reference to certain embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention but that the invention will include all embodiments falling within the scope of the appended claims.

EXAMPLES

Example 1

Synthesis of Di-Isophthaloyl Ester of DOPO-HQ

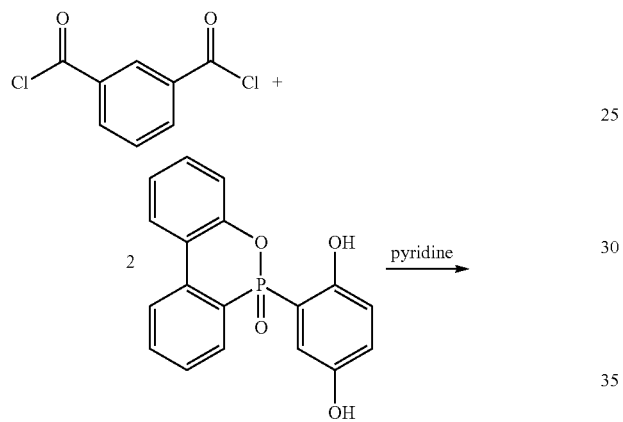

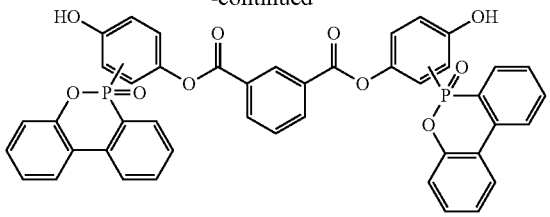

DOPO-HQ (3.2 g, 10 mmol) and pyridine (0.8 g, 10 mmol) were mixed together in 50 mL of acetone/dioxane. Isophthaloyl dichloride (1.0 g, 5 mmol) in 20 mL of acetone was added dropwise. The suspension was heated to reflux temperature, and a homogenous solution formed. After 4 h, solvents were removed under vacuum. The leftover white solid was washed with water and dried under vacuum. The final product was a white solid. $^1$H NMR (300 MHz, Acetone-$d_6$, ppm) δ 8.69-6.90 (m, 26H). $^{31}$P NMR (121 MHz, Acetone-$d_6$, ppm) δ 28. HPLC showed di-isophthaloyl ester of DOPO-HQ 74%, other higher oligomers 18%, low-molecular weight compounds 8%.

Example 2

Synthesis of Oligomeric DOPO-HQ-Isophthaloyl-Ester

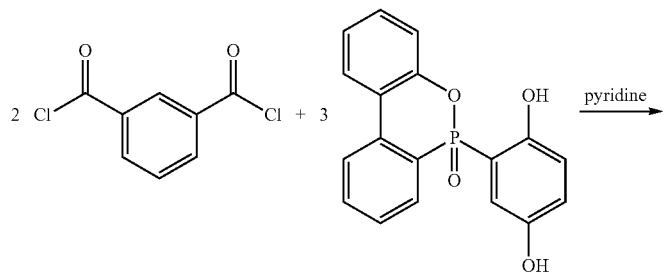

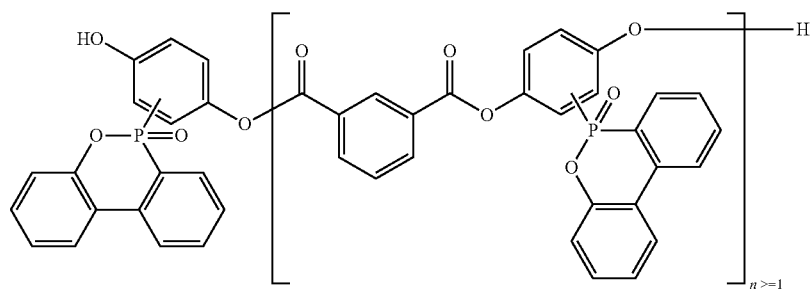

DOPO-HQ-isophthaloyl-ester (pentamer mixture): DOPO-HQ (71.9 g, 221.6 mmol) and pyridine (25 mL, 310.5 mmol) were mixed together in 200 mL of chloroform. Isophthaloyl dichloride (30.0 g, 147.8 mmol) in 50 mL of chloroform was added dropwise. The suspension was heated to reflux temperature, and a homogenous solution formed. After 3 h, the solution was cooled down to room temperature and washed with 0.5 M HCl aq solution and saturated brine. The organic layer was collected and dried over sodium sulfate. Solvents were removed under vacuum. The final product was a white solid. $^1$H NMR (300 MHz, Chloroform-d, ppm) δ 9.00-6.78 (multiple H). $^{31}$P NMR (121 MHz, Chloroform-d, ppm) δ 32.5-34, multiple peaks 18-19. HPLC showed trimer 12%, pentamer 17%, heptamer and other higher oligomers 66%.

Example 3

Synthesis of Oligomeric DOPO-HQ-Terephthaloyl-Ester

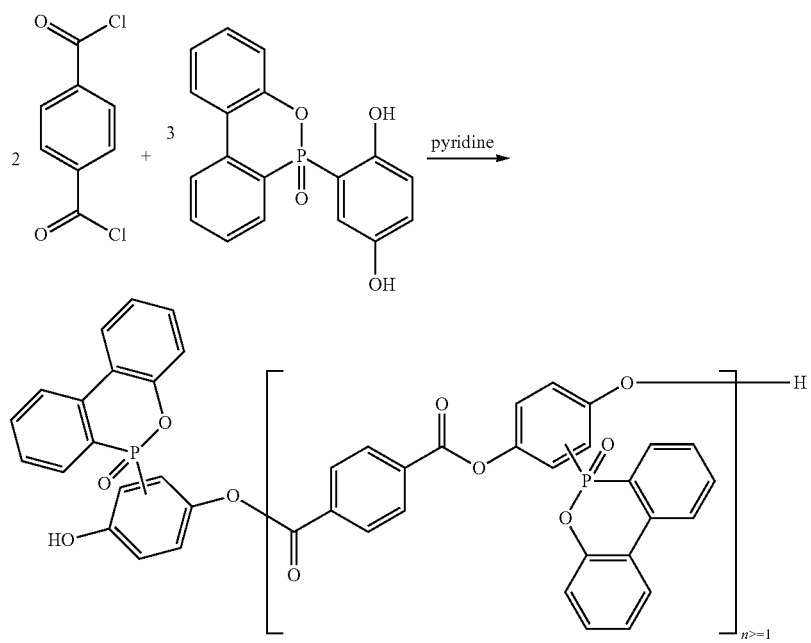

DOPO-HQ (4.8 g, 15.0 mmol) and pyridine (2.0 mL, 24.6 mmol) were mixed together in 50 mL of chloroform. Terephthaloyl dichloride (2.0 g, 9.8 mmol) in 20 mL of chloroform was added dropwise. The suspension was heated to reflux temperature for 3 h. The insoluble solids were filtered out, and the solution was washed with 0.5 M HCl aq solution and saturated brine. The organic layer was collected and dried over sodium sulfate. Solvents were removed under vacuum. The final product was a white solid. $^1$H NMR (300 MHz, Chloroform-d, ppm) δ 9.00-6.78 (multiple H). $^{31}$P NMR (121 MHz, Chloroform-d, ppm) δ 32.5-34, 18-19. HPLC showed trimer 7.2%, pentamer 29%, heptamer and other higher oligomers 60%.

Example 4

Synthesis of Oligomeric DOPO-HQ-Malonyl-Ester

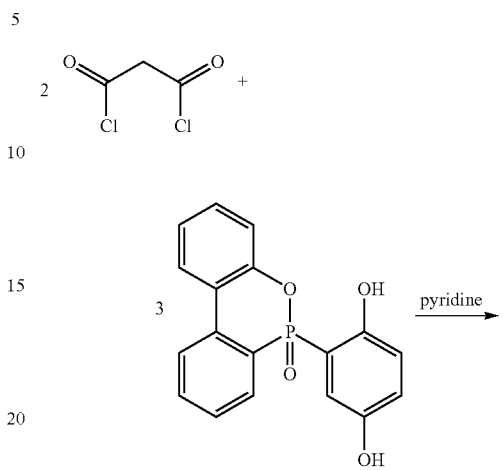

-continued

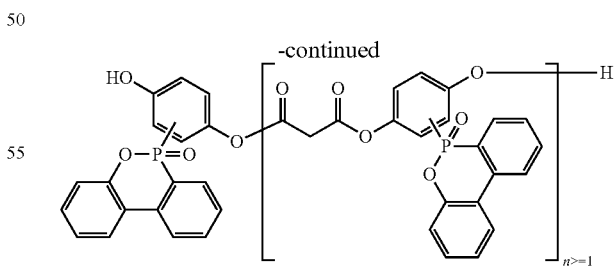

DOPO-HQ-malonyl-ester: DOPO-HQ (6.9 g, 21.3 mmol) and pyridine (2.5 mL, 28.4 mmol) were mixed together in 50 mL of chloroform. Malonyl dichloride (2.0 g, 14.2 mmol) in 20 mL of chloroform was added dropwise. The suspension was heated to reflux temperature for 6 h. The insoluble solids were filtered out, and the dark green solution was washed with 0.5 M HCl aq solution and brine. The organic layer was collected and dried over sodium sulfate. Solvents were removed under vacuum. The final product was a yellow foam. $^{31}$P NMR (121 MHz, Chloroform-d, ppm) δ 32-33, 20. HPLC showed trimer 27%, pentamer 14%, heptamer and other higher oligomers 47%.

Example 5

Synthesis of Oligomeric DOPO-HQ-Terephthaloyl-Ester

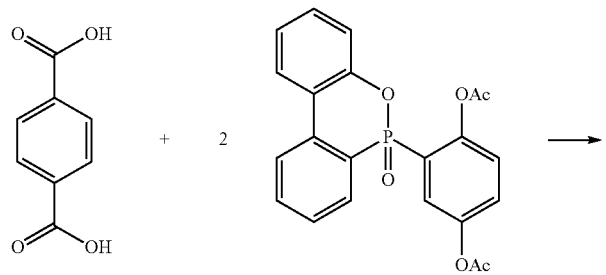

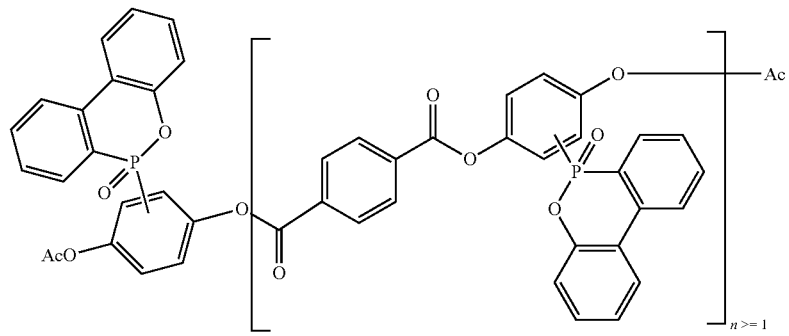

A 100 ml 4-necked flask, equipped with a mechanical stirrer and a nitrogen inlet, was charged with DOPO-HQ-Diacetate (10 g, 0.0245 mol) and heated to 170° C. to full melting. Terephthalic acid (2.03 g, 0.012 mol) was added, and the mixture was stirred over a period of 1 h. The temperature was then increased to 190° C. for 1.5 h. As the reaction continued, the mixture became more viscous. During the entire reaction, a strong flow of nitrogen was passed through the flask above the reaction mixture to drive out the formed acetic acid from the reaction zone. The resulting, very viscous, hot liquid was quickly poured onto an aluminum plate to avoid solidification in the flask. The solid light-brown product was obtained in a quantitative yield.

The product consisted of phosphorus-containing oligomeric terephthalates of formula (I), The product contained 7.6% DOPO-HQ-monoacetate and DOPO-HQ-acetate-terephthalate, 13% unreacted DOPO-HQ-Diacetate and 78.4% oligomers (HPLC area %) with the major fractions being trimers, pentamers and heptamers. The product contained 7.2% wt. phosphorus. The principal constituents of the product were identified by means of LC-MS (Table 1).

LC-MS analyses were conducted on a Dionex, UHPLC, Ultimate 3000, equipped with a PDA 200-450 nm UV detector. The column used was Phenomenex, Kinetex, Phenyl-Hexyl 100A, 250×4.6 mm, 5μ.

LC-MS conditions: 0.7 ml/min, λ=210 nm, Eluent A—water 0.055 FA, Eluent B—ACN 0.05% FA.

| Time (min) | Eluent A % | Eluent B % |
|---|---|---|
| 0 | 90 | 10 |
| 3 | 90 | 10 |
| 30 | 10 | 90 |
| 35 | 10 | 90 |
| 37 | 90 | 10 |
| 40 | 90 | 10 |

TABLE 1

LC-MS (Q-TOF ESI+) interpretation of chromatographic peaks of Example 5.

| Retention time (min) | Area % | Mw | Chemical structure |
| --- | --- | --- | --- |
| 1.02 | 0.06 | 366.066 | |
| 1.28 | 4.8 | 514.082 | |
| 1.35 | 9.6 | 408.076 | |
| 3.35 | 2.4 | 820.126 | |
| 4.60 5.40 | 47.7 | 862.137 | Isomers of |

TABLE 1-continued
LC-MS (Q-TOF ESI+) interpretation of chromatographic peaks of Example 5.
| Retention time (min) | Area % | Mw | Chemical structure |
|---|---|---|---|
| 7.70 | 17.8 | 1316.198 | 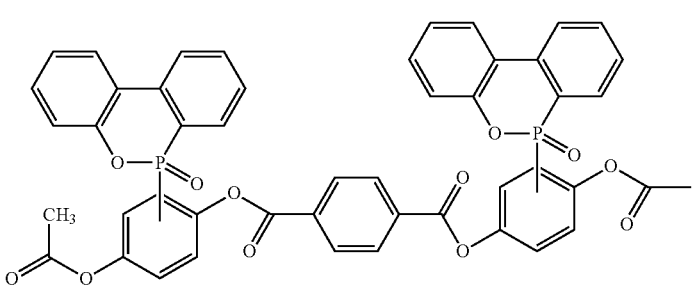 |
| 10.10 | 7.4 | 1770.258 | 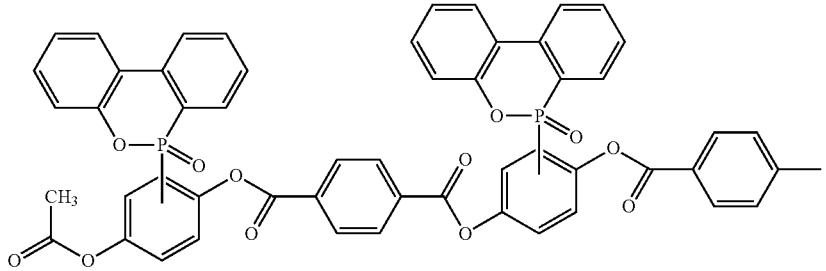 |

Example 6

Synthesis of Oligomeric DOPO-HQ-isophthaloyl-Ester

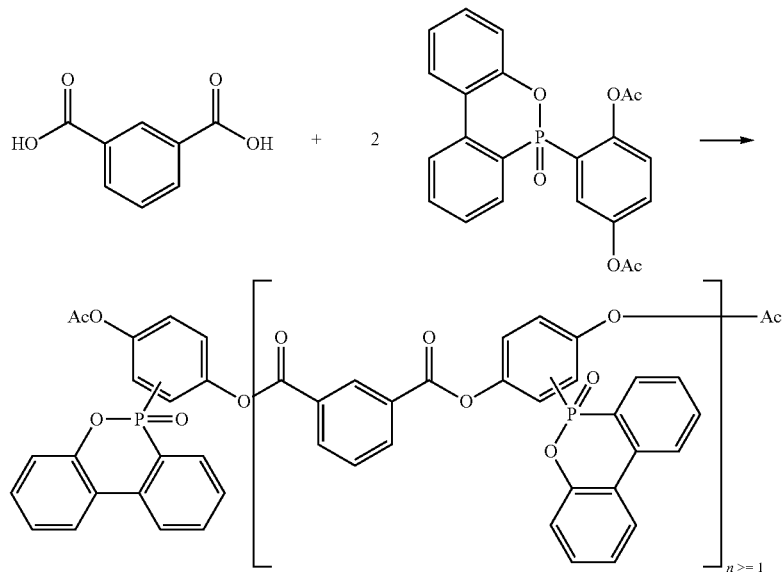

A 250 ml 4-necked flask, equipped with a mechanical stirrer, a thermometer and a nitrogen inlet, was charged with DOPO-HQ-Diacetate (100 g, 0.245 mol) and the reaction contents were heated to 170° C. with stirring, to full melting. Nitrogen was passed through the flask during the whole process. Isophthalic acid (20.34 g, 0.12 mol) was added and the reaction mixture was heated for an additional 1 h at 190° C. and 3 h at 200° C. At this point, vacuum was applied to more efficiently remove the formed acetic acid from the reaction zone, thus accelerating the polycondensation. The mixture became more viscous. The vacuum was gradually increased from about 30 mm Hg to 1 mm Hg towards the end. The resulting, very viscous, product was poured onto an aluminum plate. Solidification occurred almost instantly. The product consisted of phosphorus-containing oligomeric isophthalates of formula (I). The final solid product was ground and dried at 137° C. under vacuum to eliminate the residual acetic acid. TGA: 1% 299° C., 5% 322° C., 10% 374° C. The product contained 7.2% wt. phosphorus and was completely soluble in MEK (methyl ethyl ketone).

Example 7

Synthesis of Oligomeric DOPO-HQ-Isophthaloyl-Ester

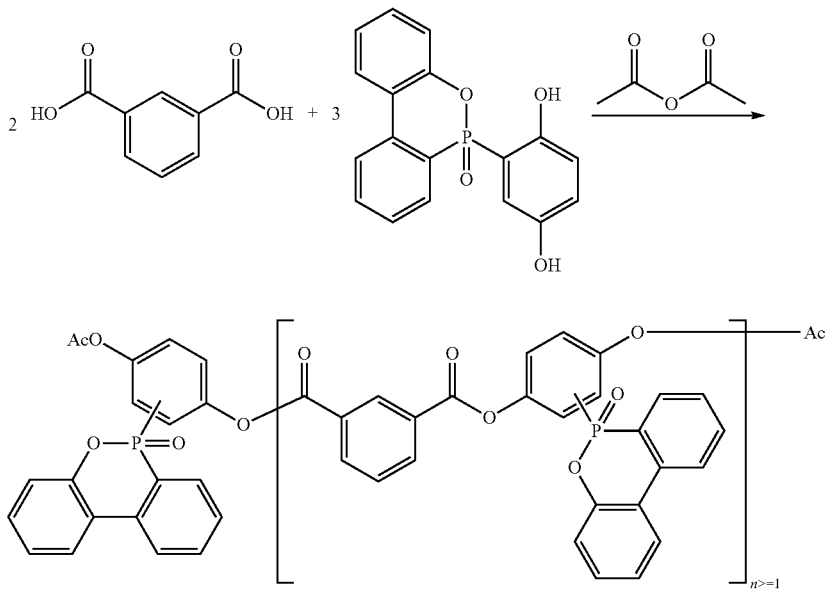

A 1 L 4-necked flask, equipped with a mechanical stirrer, a thermometer and a nitrogen inlet, was charged with DOPO-HQ (293.9 g, 0.9 mol) and acetic anhydride (367.2 g, 3.6 mol). The initial slurry became clear after 30 min at 140° C. and the solution was further heated at reflux for an additional 2 h. The formation of DOPO-HQ-Diacetate was confirmed by HPLC analysis. Isophthalic acid (100 g, 0.6 mol) was then added and the reaction mixture was heated to 200° C. At this point, vacuum was applied to remove more efficiently both the excess acetic anhydride and the formed acetic acid from the reaction zone, thus accelerating the polycondensation. The temperature was increased gradually to 250° C. over a period of 3 h. During this period, the vacuum was gradually increased from about 30 mbar to 1 mbar towards the end. The resulting, very viscous, liquid product was poured onto an aluminum plate. Solidification occurred almost instantly as the product cooled. The final solid product, obtained in a quantitative yield, had a light-brown color and contained 3.3% DOPO-HQ-monoacetate and DOPO-HQ-acetate-isophthalate, 13% unreacted DOPO-HQ-Diacetate and 83.1% oligomers (HPLC area %), with major fractions of trimers, pentamers and heptamers. Most of the constituents of the product were identified by LC-MS (Table 2). TGA: 1% 304° C., 2% 334° C., 5% 365° C., 10% 400° C. The phosphorus content in the product was 6.8%. The total content of acetic acid in the product dried under vacuum was about 0.25% (GC head-space). The product had excellent solubility in MEK. Up to 60% of oligomeric DOPO-HQ isophthalate of Example 7 was dissolved in MEK at 55° C. No precipitation was observed upon cooling to room temperature.

Example 8

Synthesis of Oligomeric DOPO-HQ-Isophthaloyl-Ester Using Potassium Acetate Catalyst Using catalyst such as potassium or sodium acetates enabled to achieve the same results as without a catalyst but using milder conditions, such as a lower temperature and higher vacuum (30 mbar instead of 1 mbar) that are more suitable for the scale-up.

A 1 L 4-necked flask, equipped with a mechanical stirrer, a thermometer and a nitrogen inlet, was charged with DOPO-HQ (293.9 g, 0.9 mol) and acetic anhydride (367.2 g, 3.6 mol). The initial slurry became clear after 30 min at 140° C. and the solution was further heated at reflux for an additional 2 h. Isophthalic acid (100 g, 0.6 mol) and 0.04 g potassium acetate were then added and the reaction mixture was heated to 220° C. At this point, vacuum was applied to remove more efficiently both the excess acetic anhydride and the formed acetic acid from the reaction zone, thus accelerating the polycondensation. The temperature was increased to 230° C. During this period, the vacuum was 30 mbar. The resulting, very viscous, liquid product was poured onto an aluminum plate. The final solid product, obtained in a quantitative yield, had a light-brown color and contained 4% DOPO-HQ-monoacetate and DOPO-HQ-acetate-isophthalate, 10% unreacted DOPO-HQ-Diacetate and 86% oligomers (HPLC area %), with major fractions of trimers, pentamers and heptamers. The phosphorus content in the product was 6.8%.

Example 9

Synthesis of Oligomeric DOPO-HQ-Isophthaloyl-Ester Starting from 9,10-Dihydro-9-oxa-10-phospha-phenanthrene-10-oxide (DOPO) and Benzoquinone A 0.25 L 4-necked flask, equipped with a mechanical stirrer, a thermometer and a nitrogen inlet, was charged with DOPO (21.6 g, 0.1 mol), benzoquinone (10.3 g, 0.095 mol) and dimethoxy ethane (50 ml). The flask was heated to reflux and maintained at that temperature for 3 h to afford a slurry of DOPO-HQ in the solvent. Subsequently, acetic anhydride (30.6 g, 0.3 mol) was introduced, followed by heating to 140° C. Dimethoxy ethane was distilled off during the heating. The initial slurry became clear after 30 min at 140° C. and the solution was further heated at reflux for an additional 2 h. Isophthalic acid (10 g, 0.06 mol) and 0.01 g potassium acetate were then added and the reaction mixture was heated to 220° C. At this point, vacuum of 30 mbar was applied to remove more efficiently both the excess acetic anhydride and the formed acetic acid from the reaction zone. The resulting, very viscous, liquid product was poured onto an aluminum plate. The final solid product, obtained in a quantitative yield, had a brown color and contained 3% DOPO-HQ-monoacetate and DOPO-HQ-acetate-isophthalate, 6% unreacted DOPO-HQ-Diacetate and 91% oligomers (HPLC area %). The phosphorus content in the product was 6.7%.

TABLE 2

| LC-MS (Q-TOF ESI+) interpretation of chromatographic peaks of Example 7 | | |
|---|---|---|
| Retention time (min) | Mw | Chemical structure |
| 1.02 | 366 | |

TABLE 2-continued
LC-MS (Q-TOF ESI+) interpretation of chromatographic peaks of Example 7
| Retention time (min) | Mw | Chemical structure |
|---|---|---|
| 1.16 2.61 | 514 | Isomers of 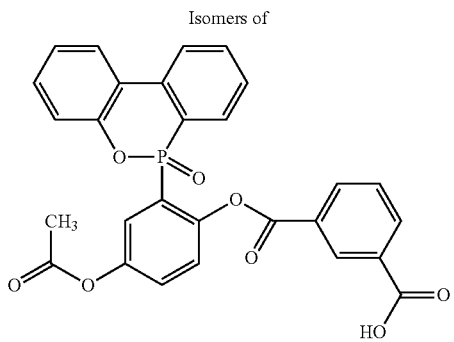 [SMILES: CC(=O)Oc1ccc(OC(=O)c2cccc(C(=O)O)c2)c(P2(=O)Oc3ccccc3-c3ccccc32)c1] |
| 1.35 | 408 | 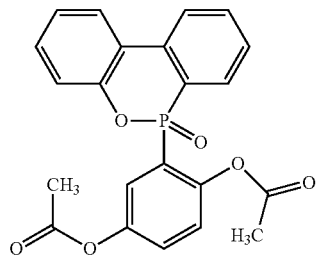 [SMILES: CC(=O)Oc1ccc(OC(C)=O)c(P2(=O)Oc3ccccc3-c3ccccc32)c1] |
| 2.80 4.51 | 820 | Isomers of 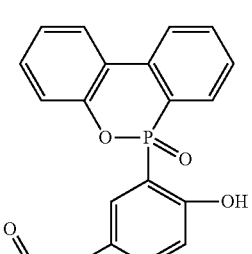 |

TABLE 2-continued
LC-MS (Q-TOF ESI+) interpretation of chromatographic peaks of Example 7
| Retention time (min) | Mw | Chemical structure |
|---|---|---|
| 3.92<br>4.99 | 862 | Isomers of 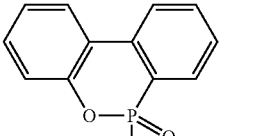 |
| 4.26<br>4.55 | 968 | Isomers of 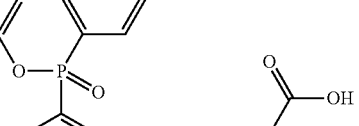 |
| 5.17<br>5.88<br>6.19<br>6.37 | 1010 | Isomers of 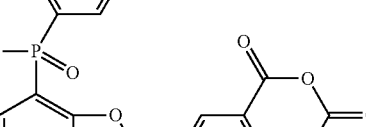 |

TABLE 2-continued
LC-MS (Q-TOF ESI+) interpretation of chromatographic peaks of Example 7
| Retention time (min) | Mw | Chemical structure |
|---|---|---|
| 6.88<br>7.53<br>7.72 | 1316 | Isomers of 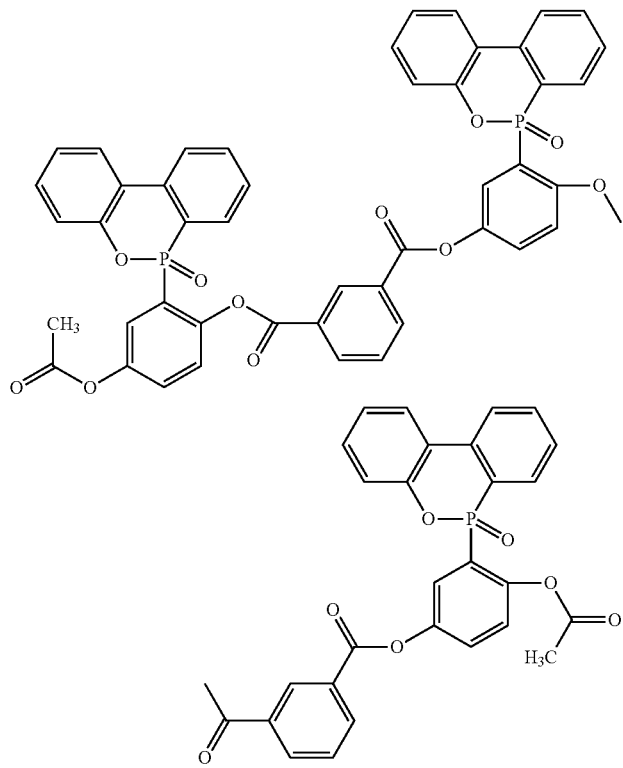 |

TABLE 2-continued
LC-MS (Q-TOF ESI+) interpretation of chromatographic peaks of Example 7
| Retention time (min) | Mw | Chemical structure |
|---|---|---|
| 7.82 8.00 8.31 | 1464 | Isomers of 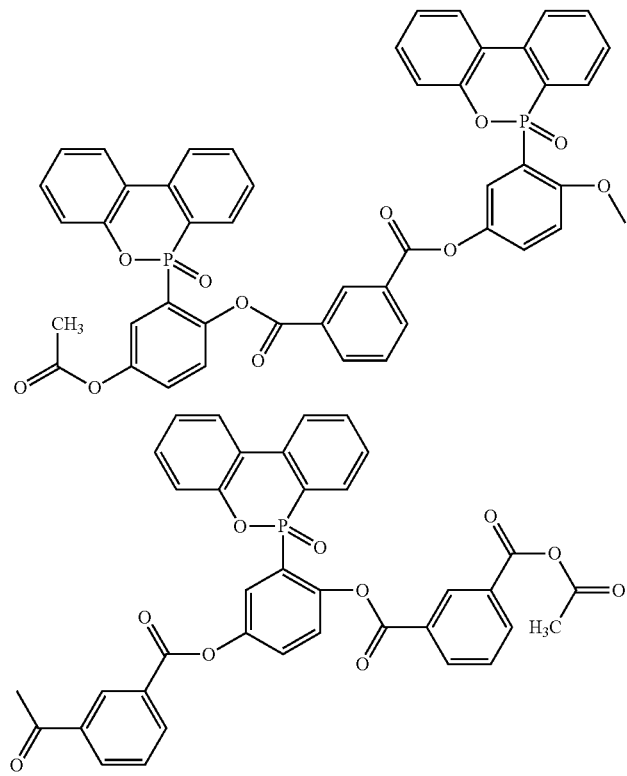 |

TABLE 2-continued

LC-MS (Q-TOF ESI+) interpretation of chromatographic peaks of Example 7

| Retention time (min) | Mw | Chemical structure |
|---|---|---|
| 8.80 9.00 9.40 | 1770 | Isomers of [structure shown] |

Comparative Example 1

Synthesis of DOPO-HQ-diacetate

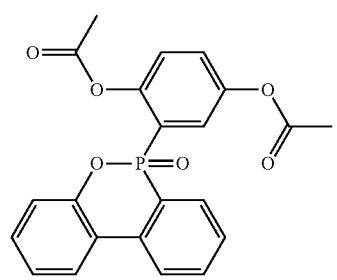 [SMILES: CC(=O)Oc1ccc(OC(C)=O)c(P2(=O)Oc3ccccc3-c3ccccc32)c1]

DOPO-HQ-diacetate: DOPO-HQ-diacetate was synthesized from DOPO-HQ and acetic anhydride. This product has very limited solubility in MEK.

Example 10

Small Scale Epoxy Curing Experiments with Curing Agents of the Invention

Samples of DOPO-HQ-derivatives prepared in Examples 1-4 and 8 were combined with epoxy and Novolac and cured on a small scale (all the materials information is listed in Table 4). Samples were cured using DEN438: EPON164 in 1:1 ratio, SD1708 as a co-curing agent and 0.2 wt % of 2-methyimidazole as catalyst. Total % P was 2.4-2.7%. The epoxy was cured at 165-195° C. for 2 hours and post-cured at 180-210° C. for 1 hour. Thermal stability of the samples was studied using DSC and TGA. To prepare varnish castings for Dk and Df measurements, composition A was blended with DEN438: EPON164 in 1:1 ratio, co-curing agent SD1708 and catalyst 2-methyimidazole. 10"×10" aluminum foils were coated single-side using the sample-epoxy blend. After coating the foils were air dried followed by "B"-staging at 165° C. (3'50"). The epoxy was peeled from the foil, followed by molding and curing at 200° C. for 2-3 hours and post-curing at 210-220° C. for 1 hour. The results are shown in Table 3:

TABLE 3

Composition, Tg, TGA and electrical properties for small scale curing experiments

| Compounds | Composition (wt %) | | | $T_g$, ° C. | Temp@weight, ° C. 98%/95%/90% | Dk/Df (1 GHz) |
|---|---|---|---|---|---|---|
| | EPON164 | DEN438 | SD1708 | | | |
| Example 1 | 30.3 | 24.8 | 11.0 | 176 | 357/394/409 | |
| Example 2 | 29.6 | 24.3 | 10.2 | 173 | 341/390/407 | |
| Example 3 | 29.6 | 24.3 | 10.2 | 179 | 321/371/400 | |
| Example 4 | 29.5 | 24.1 | 10.7 | 178 | 324/383/406 | |
| Example 8 | 29.0 | 23.7 | 10.3 | 175 | 344/382/401 | 3.26/0.019 |
| Comparative Example 1 | 29.7 | 24.3 | 10.0 | 161 | 358/389/405 | |

Example 11

Laminate Preparation with DOPO-HQ-Derivatives

The composition A, synthesized in Example 2 was explored as a co-curing agent for the epoxy laminate application. The composition A together with phenolic Novolac was used to cure multi-functional epoxy resins DEN 438 and EPON 164. All the materials information is listed in Table 4. The solids content was maintained at 66.67% with the addition of MEK/Dowanol (80/20) solvent mixture. A varnish formulation was prepared therefrom which had a phosphorous content of 2.7% and the composition contents are shown in Table 5.

TABLE 4

Materials

| Trade Name (Producer) | General Information | Function |
|---|---|---|
| SD-1708 (ex Momentive) | Phenolic novolac | Curing agent |
| DEN 438 (ex Dow Chemicals) | Phenol novolac epoxy | Epoxy resin |
| EPON 164 (ex Momentive) | Cresol novolac epoxy | Epoxy resin |
| Methyl ethyl ketone (ex Fluka) | Butan-2-one | Solvent |
| Dowanol (ex Fluka) | 1-methoxy 2-propanol | Solvent |
| Dimethyl formamide (ex Fluka) | N,N-Dimethylformamide | Solvent |
| 2-MI (ex Air Products) | 2-methyl imidazole | Catalyst |
| Glass Cloth (ex BGF Industries) | E-Glass | Reinforcing agent |
| Copper foil (ex Gould Electronics) | JTC, 1.0 oz/ft$^2$ | Resistance to oxidation in warm and humid environments and for precise etching behavior and others |

TABLE 5

Epoxy laminate formulation for Example 11

| DEN 438 (wt %) | EPON 164 (wt %) | Composition A (wt %) | SD-1708 (wt %) | 2-mI (wt %) |
|---|---|---|---|---|
| 24.30 | 29.70 | 35.84 | 10.15 | 0.02 |

The catalyst addition was carefully controlled by adding small incremental amounts of 2-methylimidazole (2-mI) solution (20 weight % solids solution in DMF) to obtain an optimum varnish gel time of 270 seconds at 171° C. according to IPC-TM-650 test 2.3.18.

A glass fabric (17 inches X 36 inches) was continuously passed through a trough containing the varnish and through squeeze rolls such that a uniform coating was obtained. Sections of the coated fabric were hanged in the hood overnight for slow evaporation of solvent. Prepregs were made by drying the resin coated glass fabric in a preheated air circulated oven at 160° C. for 4'30" (four minutes and thirty seconds), which gave a resin flow less than 20.0%. Also, the resin content was controlled to be over 50-55%, which is determined through the difference in weight between the glass fabric and the prepreg. The prepreg gel time was determined by collecting the fusible, thermoplastic resin by crushing the prepreg in a zip-lock bag. The collected resin was placed on the hot-plate at 171° C. and the gel time determined. The prepreg properties are shown in Table 6 below:

TABLE 6

Prepreg properties with Composition A as shown in Table 5

| Formulation of Composition A as shown in Table 5 | IPC-TM-650 No. | Value |
|---|---|---|
| Resin content (wt %) | 2.3.16.2 | 50-55 |
| Varnish gel time (sec) | 2.3.18 | 270 |
| Prepreg gel time (sec) | 2.3.18 | 81 |
| Resin Flow (%) | 2.3.17 | <20 |

A circular stack of 4 prepregs with a diameter of 25 mm was placed between disposable aluminum (Al) plates to study the rheological behavior of the B-stage prepreg by electrically heating the resin to 200° C. at 5° C./min in an AR2000ex Rheometer. A continuous controlled strain condition within the linear viscoelastic region of the prepreg was maintained along with the normal force control that accounts for volume changes occurring in the resin with change in temperature.

Figure 2:
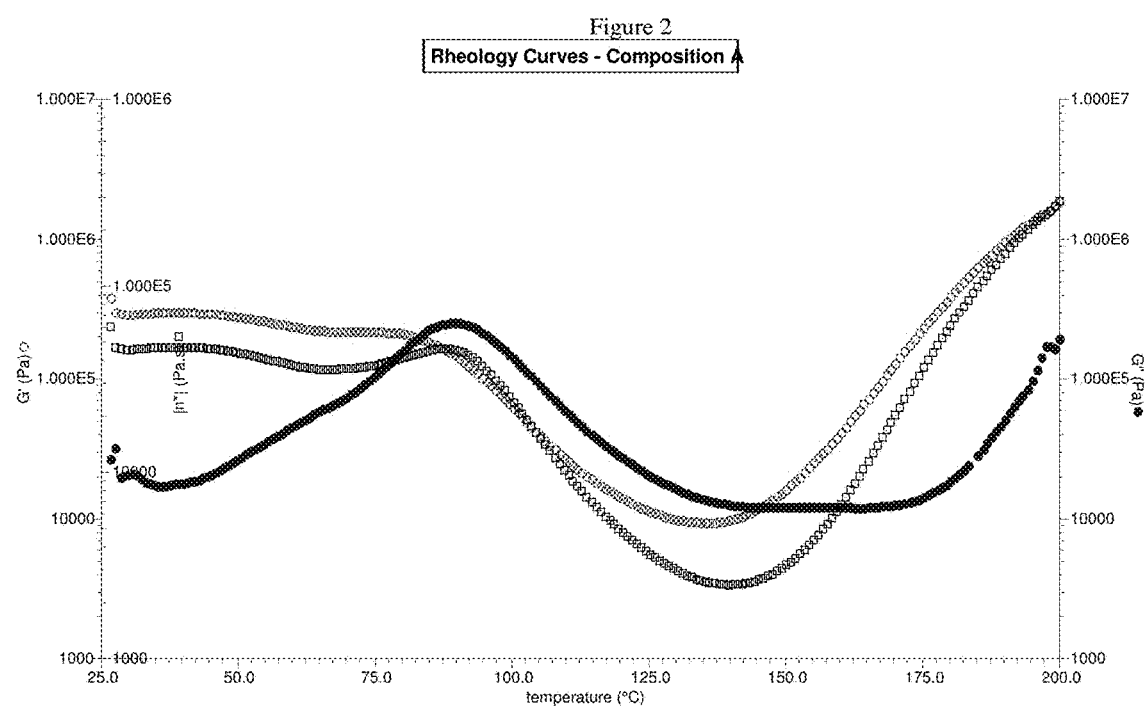
FIG. 2 is a graph of rheology curves of overlays of storage modulus (G'—open circles), loss modulus (G"—filled circles) and complex viscosity (|η|—open squares) of the B-staged resin system containing Composition A in a rheometer.
Figure 3:
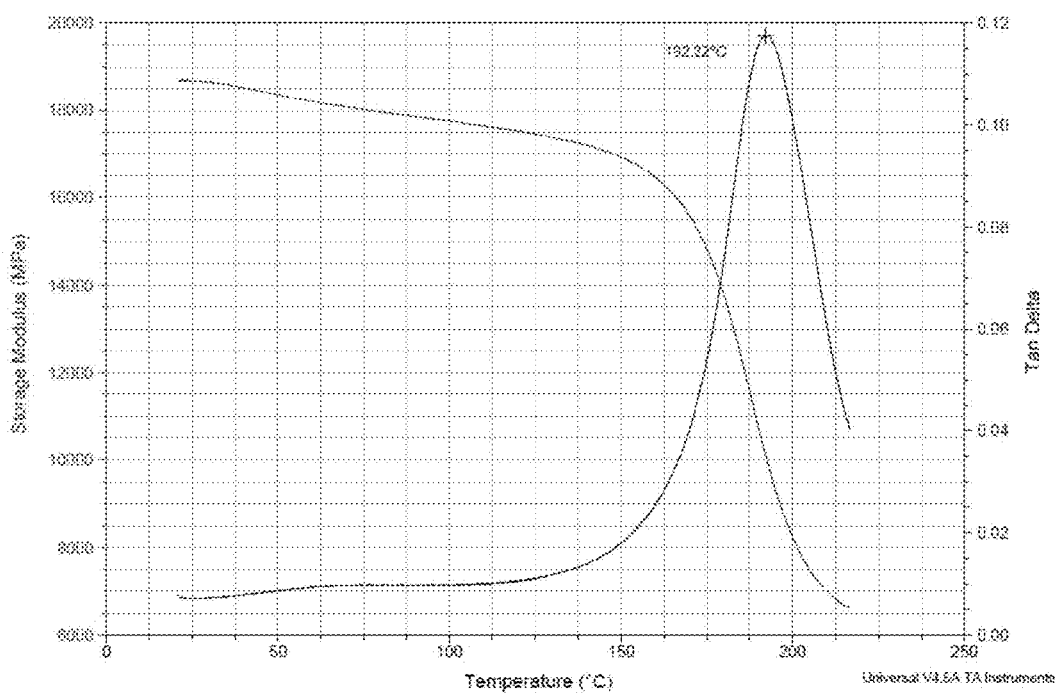
FIG. 3 is a graph of DMA measurement of Tg for the laminate (3° C./min) containing Composition A.
Figure 4:
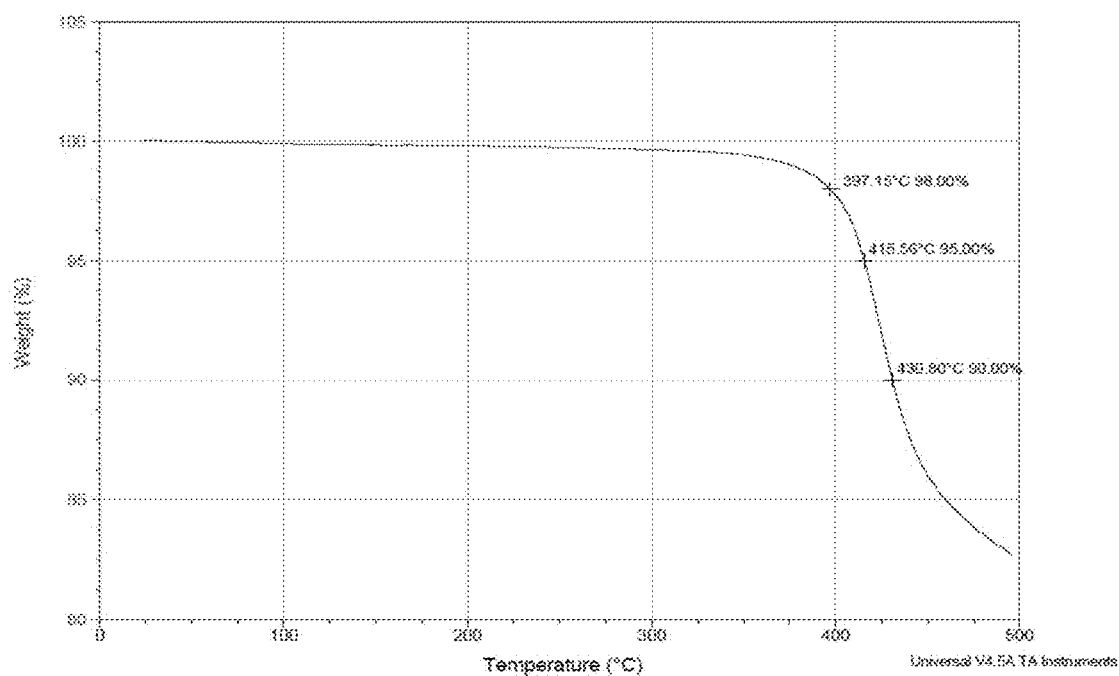
FIG. 4 is a graph of the TGA measurement of T$_d$ for the laminate containing Composition A (10° C./min).

Based on rheology curves, the final curing temperature for the laminate was selected above 179° C. Based on the rheology curve, the curing cycle was designed to obtain a good wetting of the glass cloth. FIG. 1 shows the complex viscosity profile of the prepreg with rise in temperature of the B-staged resin system in an oscillatory testing mode. FIG. 2 shows the overlay curves for the storage modulus (G'), loss modulus (G") and complex viscosity (|η|) of the B-staged resin system. Based on the FIGS. 1 and 2, the curing cycle was designed to obtain a good wetting of the glass cloth. A low initial pressure of 10 psi was applied at 103-105° C. (the complex viscosity of the prepreg was around 17560 pa-s) and sufficient to wet the glass fabric as studied during the preparation of various experimental epoxy laminates. Subsequently 20 psi pressure was applied at 140° C. and the pressure was maintained at 20 psi until 165° C. The pressure was again raised to 50 psi at 165° C. and 100 psi once the press reached 175° C. A pressure of 100 psi was applied at 175° C. and finally a pressure of 220 psi was applied at 195° C.

Finally, the press was maintained at 220 psi and 195° C. isothermally for 90 minutes. The laminate showed a good resin flow and the thickness of the final laminate was close to 1.3 mm (without copper). The laminate was rated as a borderline V-0 with a maximum burn time of 7 seconds by following ASTM D3801-10 standard using an Atlas UL-94 burning chamber (V-0 being the highest possible rating).

The glass transition temperature (Tg) of the multilayer laminate was determined to be 192° C. by Dynamic Mechanical Analysis (DMA) in a single-cantilever mode at a ramp rate of 3° C./min. The thermal decomposition temperature of the composite at 5 weight % loss is 416° C. as measured by Thermogravimetric Analysis (TGA) at a heating rate of 10° C./min in an inert atmosphere of nitrogen.

Four specimens for the Pressure Cooker Test (PCT) were cut from the epoxy laminate containing Composition A and placed in the pressure cooker for 30 minutes at 121° C. and 15 psi. The water uptake of the test coupons was around 0.07-0.14 weight % with average of about 0.1%. Three test specimens do not exhibit any blistering and were graded as Condition 5 according to the IPC test criteria. One test specimen exhibited a blister and graded as Condition 1.

Example 12

Laminate Preparation with DOPO-HQ-Derivatives

The composition A, synthesized in Example 8 was explored as a co-curing agent for the epoxy laminate application. The composition A together with phenolic Novolac was used to cure multi-functional epoxy resins DEN 438 and EPON 164. All the materials information is listed in Table 4. The solids content was maintained at 65-66% with the addition of MEK/Dowanol (80/20) solvent mixture. A varnish formulation was prepared therefrom which had a phosphorous content of 2.4% and the composition contents are shown in Table 7.

TABLE 7

| Varnish Formulation for Example 12 | | | | |
|---|---|---|---|---|
| DEN 438 (wt %) | EPON 164 (wt %) | Composition A (wt %) | SD-1708 (wt %) | 2-MI (wt %) |
| 24.0 | 29.4 | 35.3 | 11.3 | 0.02 |

A varnish was formulated from material prepared for sampling purposes to confirm its performance in a glass filled laminate. The varnish was prepared using a MEK/Dowanol (80/20) solvent mixture. After determining gel times of the FR varnish by adjusting the catalyst level the glass fabric panels were coated by passing them through a trough containing the varnish then pulled between rollers of a predetermined gap allowing excess material to be forced out leaving a smooth uniform coating. The higher solids content of the varnish made the coating process more difficult. The coated panels were hung to air dry overnight. After drying the four 18"×30" panels were cut into 8.5 inch squares prior to "B" staging at 165° C. in a forced air oven. The laminate was made using 8 plies of each prepreg between 2 sheets of 35 μm copper foil. The stack was then placed in a heated press. Temperature and pressure were ramped following a viscosity profile obtained from an AR200ex rheometer. A final pressure of 200 psi at 195° C. was applied to the laminate and held for 1 hour 15 min prior to cooling. After removing the copper cladding test samples were cut to determine FR and thermal properties of the laminate. Following UL94 protocol the laminate was rated V-0 with burn times of 6 s. The Tg of the laminate was 194° C. The laminate passed the PCT at 1, 1.5, and 2$^i$ hours. All surfaces being rated Condition 5.

TABLE 8

| Prepreg and laminate properties with Composition A as shown in Table 7 | |
|---|---|
| Prepreg Properties | |
| Resin content (wt %) | 36 |
| Varnish gel time at 171° C. (seconds) | 318 |
| "B" staging at 165° C. (seconds) | 180 |
| Flow (%) | >5 |
| Laminate Properties | |
| Laminate thickness (mm) | 1.5 |
| Resin content (wt %) | 31 |
| Glass Transition Temperature (DMA) | 194 |
| Thermal Decomposition at 5 wt % Loss) | 400 |
| Flammability (UL-94) | V-0 |
| Total burn time (sec) | 32 |
| Maximum burn time (sec) | 6 |
| Water uptake after PC test (%) | 0.3 |
| Pressure Cooker Test     1 hour | pass 100% |
|                        1.5 hour | pass 100% |
|                        2 hour | pass 100% $^i$ |
| Peel strength (pound/inch) | 8.2 |
| T-288 (min) | >60 |
| CTE-Z (ppm/° C.) α1/α 2 | 41/185 |
| CTE (%), 50-260° C.; TMA | 2.2 |

$^i$ using formulation of composition A (36.8 wt %) with DEN 438 (50.9 wt %), SD 1708 (12.4 wt %) and catalyst 2-MI.

Comparative Example 2

Laminate Preparation

Table 9: Formulation of DOPO-HQ-diacetate from comparative Example 1 (synthesis) at 2.7% P in final epoxy varnish with Dowanol as solvent. This product was difficult to formulate due to limited solubility.

TABLE 9

| DEN 438 | EPON 164 | DOPO-HQ-diacetate | SD-1708 | 2-mI |
|---|---|---|---|---|
| 24.3 | 29.7 | 35.8 | 10 | 0.065 |

TABLE 10

Prepreg and Laminate Properties with formulation as shown in Table 9

| Prepreg Properties | IPC-TM-650 No. | Value |
|---|---|---|
| Resin content (wt %) | 2.3.16.2 | 35-45 |
| Varnish gel time (sec) [171° C.] | 2.3.18 | 390 |
| Prepreg gel time (sec) | 2.3.18 | 210 |
| Flow (%) [165° C., 2'02"] | 2.3.17 | 3 |
| Laminate Properties | | |
| Glass Transition Temperature (DMA—3° C./min) | | 150 |
| Flammability (UL-94) | | V-0, maximum burn time 2 seconds |
| Thermal Decomposition (5 wt % Loss—10° C./min) | | 418 |
| Pressure Cooker Test (30 minutes) | | Around 0.22 wt % water uptake and 4 out of 4 samples passed the test |

The invention claimed is:

1. An epoxy resin composition comprising a thermosetting resin and a phosphorus-containing aromatic polyester of formula (I) which is concurrently a flame retardant and an active ester curing agent

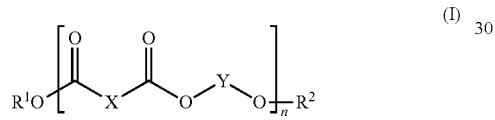

where X is a bivalent aromatic hydrocarbon group containing from 6 to about 12 carbon atoms, and optionally substituted with an alkyl group or alkoxyl group, containing up to about 6 carbon atoms, or X is a bivalent linear or branched alkylene group of from 1 to 8 carbon atoms, or a bivalent linear or branched alkenylene group of from 2 to about 8 carbon atoms, Y is

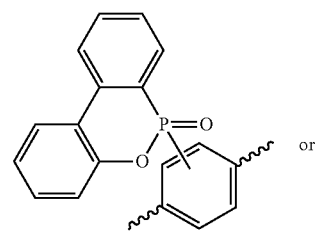

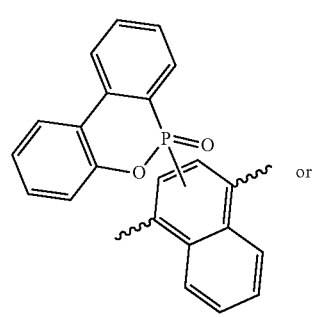

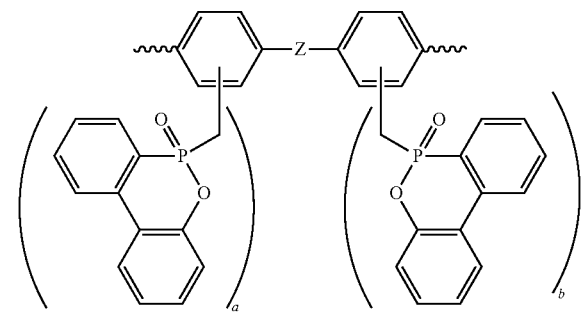

where Z is selected from the group consisting of a covalent bond, —SO$_2$—, —C(CH$_3$)$_2$—, —CH(CH$_3$)—, and —CH$_2$—; a=0-2; b=0-2, and a and b are not both zero, and wherein the wavy lines of each structure of Y indicate the bonds to the O atoms which Y bridges in the general formula (I);

R$^1$ is, an alkyl group of from 1 to about 4 carbon atoms, phenyl, naphthyl,

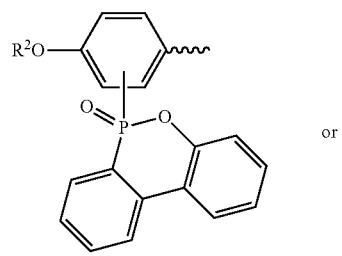

or

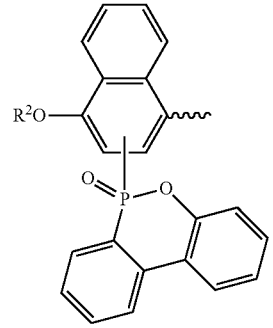

where R$^2$ is —C(=O)R$^3$ and where R$^3$ is selected from an alkyl group of from 1 to 4 carbon atoms, a phenyl group, and a napthyl group and n is ≥1, and wherein the phosphorus-containing aromatic polyester of formula (I) is such that when it is reacted with the thermosetting resin, produces a product which does not contain any secondary hydroxyl groups.

2. An epoxy resin composition consisting of a thermosetting resin and a phosphorus-containing aromatic polyester of formula (I) which is concurrently a flame retardant and an active ester curing agent

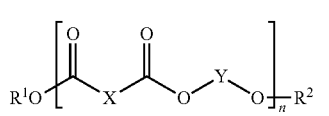
(I)

where X is a bivalent aromatic hydrocarbon group containing from 6 to about 12 carbon atoms, and optionally substituted with an alkyl group or alkoxyl group, containing up to about 6 carbon atoms, or X is a bivalent linear or branched alkylene group of from 1 to 8 carbon atoms, or a bivalent linear or branched alkenylene group of from 2 to about 8 carbon atoms, Y is

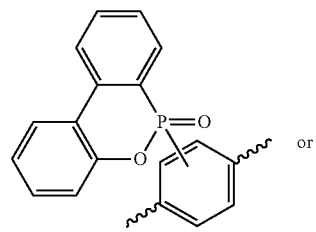
(i)

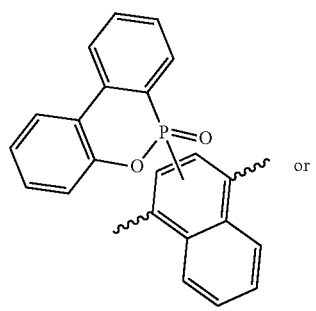
(ii)

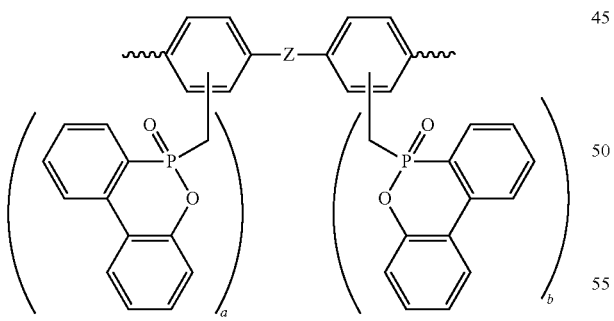
(iii)

where Z is selected from the group consisting of a covalent bond, —SO$_2$—, —C(CH$_3$)$_2$—, —CH(CH$_3$)—, and CH$_2$—; a=0-2; b=0-2, and a and b are not both zero, and wherein the wavy lines of each structure of Y indicate the bonds to the O atoms which Y bridges in the general formula (I);

R$^1$ is an alkyl group of from 1 to about 4 carbon atoms, phenyl, naphthyl,

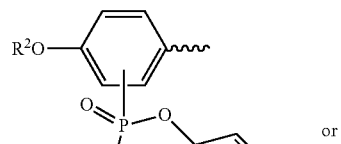

or

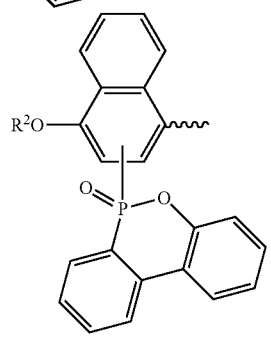

where R$^2$ is —C(=O)R$^3$ and where R$^3$ is selected from an alkyl group of from 1 to 4 carbon atoms, a phenyl group, and a napthyl group, and n is ≥1.

3. The composition of claim 2, wherein the phosphorus-containing aromatic polyester of formula (I) is such that when it is reacted with the thermosetting resin, produces a product which does not contain any secondary hydroxyl groups.

4. The composition of claim 1 wherein R$^1$ is

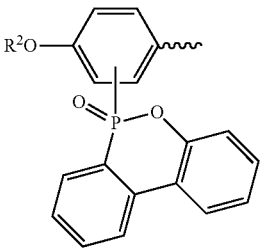

and where X is a bivalent aromatic hydrocarbon group of from 6 to 12 carbon atoms which is optionally substituted with an alkyl or alkoxy group of up to 6 carbon atoms.

5. The composition of claim 1 wherein R$^1$ is an alkyl of from 1 to about 4 carbon atoms and where X is a bivalent aromatic hydrocarbon group of from 6 to 12 carbon atoms which is optionally substituted with an alkyl or alkoxy group of up to 6 carbon atoms.

6. The composition of claim 1 wherein R$^1$ is

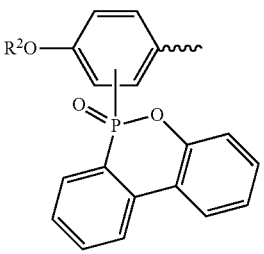

and where X is a bivalent linear or branched alkylene group of from 1 to 8 carbon atoms, or a bivalent linear or branched alkenylene group of from 2 to about 8 carbon atoms.

7. The composition of claim 1 wherein $R^1$ is an alkyl of from 1 to about 4 carbon atoms and where X is a bivalent linear or branched alkylene group of from 1 to 8 carbon atoms, or a divalent linear or branched alkenylene group of from 2 to about 8 carbon atoms.

8. The composition of claim 1 wherein X is a bivalent aromatic hydrocarbon group of from 6 to 12 carbon atoms which is optionally substituted with an alkyl or alkoxy group of up to 6 carbon atoms.

9. The composition of claim 1 wherein X is a divalent linear or branched alkylene group of from 1 to 8 carbon atoms, or a divalent linear or branched alkenylene group of from 2 to about 8 carbon atoms.

10. The composition of claim 1 wherein n is from 1 to about 100.

11. The composition of claim 1 wherein the thermosetting resin is an epoxy resin.

12. The composition of claim 1 wherein the thermosetting resin is an epoxy resin selected from the group consisting of halogen-free epoxies, phosphorus-free epoxies, and phosphorus-containing epoxies and mixtures thereof.

13. The composition of claim 1 wherein the curing agent compound is present in an amount of from about 10 to about 150 parts by weight per 100 parts of the thermosetting resin.

14. An article comprising the composition of claim 1.

15. The article of claim 14 wherein said article can be used in lead free soldering applications and electronic devices.

16. The article of claim 14 wherein the article further comprises a copper foil.

17. The article of claim 14 wherein said article is a printed circuit board.

18. Any one of a coating formulation, an encapsulant, a composite, an adhesive, a molding a bonding sheet or a laminated plate comprising the composition of claim 1.

19. A prepreg comprising the composition of claim 1.

20. A printed wiring board comprising prepreg of claim 19.

21. A laminate or a bonding sheet comprising the composition of claim 1.

22. A printed wiring board comprising the laminate of claim 21.

23. A process of making a laminate that contains the composition of claim 21 comprising impregnating the composition into a filler material, to form a prepreg, followed by processing the prepreg at elevated temperature to promote partial cure to a B-stage and then laminating two or more of said prepregs at elevated pressure and temperature to form a laminate.

24. A printed circuit board made by the process of claim 23.

* * * * *